(12) United States Patent
Hopper et al.

(10) Patent No.: US 10,665,735 B2
(45) Date of Patent: May 26, 2020

(54) MICRO-FABRICATED ATOMIC CLOCK STRUCTURE AND METHOD OF FORMING THE ATOMIC CLOCK STRUCTURE

(71) Applicant: Texas Instruments Incorporated, Dallas, TX (US)

(72) Inventors: Peter J. Hopper, San Jose, CA (US); William French, San Jose, CA (US); Paul Mawson, Los Gatos, CA (US); Steven Hunt, San Jose, CA (US); Roozbeh Parsa, San Jose, CA (US); Martin Fallon, Glascow (GB); Ann Gabrys, Santa Clara, CA (US); Andrei Papou, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/703,364

(22) Filed: May 4, 2015

(65) Prior Publication Data
US 2015/0311355 A1   Oct. 29, 2015

Related U.S. Application Data

(62) Division of application No. 13/345,688, filed on Jan. 7, 2012, now Pat. No. 9,024,397.

(51) Int. Cl.
*G01R 33/02* (2006.01)
*H01L 21/58* (2006.01)
(Continued)

(52) U.S. Cl.
CPC .............. *H01L 31/024* (2013.01); *G04F 5/14* (2013.01); *H01L 31/00* (2013.01);
(Continued)

(58) Field of Classification Search
CPC ....... H01L 2924/00; H01L 2224/45144; H01L 2924/0002; H01L 2224/45015; H01L 2224/48624; H01L 2924/01006; H01L 2924/12032; H01L 2924/12042; H01L 2924/12043; H01L 2924/1306; H01L 27/2463; H01L 45/12; H01L 45/1233; H01L 51/04; H01L 31/024; H01L 31/18;
(Continued)

(56) References Cited

U.S. PATENT DOCUMENTS

| 8,629,524 B2 * | 1/2014 | Wang | H01L 27/14618 |
| | | | 257/432 |
| 9,543,735 B2 * | 1/2017 | Parsa | H01L 31/109 |
| 2002/0157247 A1 * | 10/2002 | Li | C22C 1/1036 |
| | | | 29/840 |
| 2007/0266784 A1 * | 11/2007 | Lust | G01C 19/62 |
| | | | 73/504.05 |

(Continued)

OTHER PUBLICATIONS

Chung, Materials for thermal conduction, 2001, Applied Thermal Engineering 21 (2001) 1593-1605 (Year: 2001).*

*Primary Examiner* — Mary A Wilczewski
*Assistant Examiner* — Tsz K Chiu
(74) *Attorney, Agent, or Firm* — Dawn Jos; Charles A. Brill; Frank D. Cimino

(57) ABSTRACT

A micro-fabricated atomic clock structure is thermally insulated so that the atomic clock structure can operate with very little power in an environment where the external temperature can drop to −40° C., while at the same time maintaining the temperature required for the proper operation of the VCSEL and the gas within the vapor cell.

1 Claim, 33 Drawing Sheets

(51) Int. Cl.
  *H01L 29/82* (2006.01)
  *H01L 31/024* (2014.01)
  *H01L 31/00* (2006.01)
  *H01L 31/0224* (2006.01)
  *H01L 31/103* (2006.01)
  *H01L 31/18* (2006.01)
  *G04F 5/14* (2006.01)
  *H03L 7/26* (2006.01)

(52) U.S. Cl.
  CPC .... *H01L 31/022408* (2013.01); *H01L 31/103* (2013.01); *H01L 31/18* (2013.01); *H01L 31/1804* (2013.01); *H03L 7/26* (2013.01); *Y02E 10/547* (2013.01)

(58) Field of Classification Search
  CPC ... H01L 31/00; H01L 31/1804; H01L 31/103; H01L 31/022408; H03L 7/26; G04F 5/14; Y02E 10/547
  USPC .......... 324/252; 257/421, E21.505, E29.323; 438/56
  See application file for complete search history.

(56) References Cited

U.S. PATENT DOCUMENTS

| | | | |
|---|---|---|---|
| 2008/0014667 A1* | 1/2008 | Hooper | H01L 33/007 438/31 |
| 2011/0187465 A1* | 8/2011 | Youngner | G04F 5/145 331/94.1 |
| 2013/0015850 A1* | 1/2013 | Lindorfer | G01R 33/032 324/244 |
| 2013/0147472 A1* | 6/2013 | French | G01R 33/032 324/252 |
| 2015/0369604 A1* | 12/2015 | Overstreet, II | G01C 19/62 324/304 |

* cited by examiner

210 — FORM A PHOTODIODE WAFER THAT HAS A SUBSTRATE, A NUMBER OF CIRCUIT ELEMENTS THAT LIE WITHIN THE SUBSTRATE, AND A METAL INTERCONNECT STRUCTURE THAT TOUCHES THE SUBSTRATE. THE METAL INTERCONNECT STRUCTURE, WHICH IS ELECTRICALLY CONNECTED TO THE NUMBER OF CIRCUIT ELEMENTS, HAS A NUMBER OF METAL-1 TRACES AND A NUMBER OF METAL-2 TRACES. THE METAL-2 TRACES HAVE A THERMAL CONDUCTIVITY THAT IS GREATER THAN THE THERMAL CONDUCTIVITY OF THE METAL-1 TRACES, AND A RESISTANCE THAT IS LESS THAN THE RESISTANCE OF THE METAL-1 TRACES.

212 — FORM A VAPOR CELL WAFER THAT HAS A VAPOR CELL OPENING AND A THERMAL BARRIER OPENING THAT EACH EXTEND COMPLETELY THROUGH THE VAPOR CELL WAFER. THE THERMAL BARRIER OPENING, WHICH IS SPACED APART FROM THE VAPOR CELL OPENING, LATERALLY SURROUNDS THE VAPOR CELL OPENING.

214 — FORM A LID WAFER THAT HAS AN ACCESS OPENING THAT EXTENDS COMPLETELY THROUGH THE LID WAFER, AND AN IONIC BARRIER STRUCTURE THAT PROVIDES A BARRIER TO THE DIFFUSION OF IMPURITY IONS.

216 — ATTACH THE VAPOR CELL WAFER TO THE PHOTODIODE WAFER TO FORM AN INTERMEDIATE WAFER. THE INTERMEDIATE WAFER HAS A VAPOR CELL CAVITY AND A THERMAL BARRIER CAVITY, WHICH ARE FORMED BY THE PHOTODIODE WAFER CLOSING ONE SIDE OF THE VAPOR CELL OPENING AND ONE SIDE OF THE THERMAL BARRIER OPENING. THE VAPOR CELL CAVITY, IN TURN, INDLUDES A GAS REGION, A CHANNEL REGION, AND A DEPOSITION REGION.

218 — PLACE A SUBSTANCE WHICH CAN BE DECOMPOSED BY ULTRAVIOLET (UV) LIGHT INTO ALKALI AND BARRIER ATOMS INTO THE VAPOR CELL CAVITY.

220 — ATTACH THE LID WAFER TO THE INTERMEDIATE WAFER TO FORM A PHOTOCELL WAFER THAT HAS A HERMETICALLY SEALED VAPOR CELL AND AN EXPOSED THERMAL BARRIER OPENING.

FIG. 2A

238 — FORM A LASER SUPPORT WAFER THAT HAS A SUBSTRATE AND A METAL INTERCONNECT STRUCTURE THAT TOUCHES THE SUBSTRATE. THE METAL INTERCONNECT STRUCTURE HAS A NUMBER OF METAL-1 TRACES, A NUMBER OF METAL-2 TRACES AND A NUMBER OF METAL-3 TRACES. THE METAL-1 AND METAL-3 TRACES INCLUDES METALS WHICH HAVE A RESISTANCE THAT IS LOWER THAN THE RESISTANCE OF THE METAL-2 TRACES. IN ADDITION, THE METAL-1 TRACES HAVE A THERMAL CONDUCTIVITY THAT IS GREATER THAN THE THERMAL CONDUCTIVITY OF THE METAL-2 TRACES.

240 — PHYSICALLY AND ELECTRICALLY ATTACH A VCSEL TO EACH DIE REGION OF THE LASER SUPPORT WAFER TO FORM A VCSEL WAFER.

242 — ATTACH A THERMAL PHOTO-OPTICAL DIE TO EACH DIE REGION OF THE VCSEL WAFER TO FORM A THERMAL CLOCK STRUCTURE WAFER.

244 — DICE THE THERMAL CLOCK STRUCTURE WAFER IN A CONVENTIONAL MANNER AND FORM A NUMBER OF THERMAL CLOCK STRUCTURE DIE.

246 — ATTACH A THERMAL CLOCK STRUCTURE DIE TO A DIE ATTACH PAD (DAP) OF A METAL LEAD FRAME OF A PACKAGE.

248 — ATTACH A NUMBER OF BONDING WIRES TO THE THERMAL CLOCK STRUCTURE DIE AND THE METAL LEAD FRAME AND FORM A WIRED CLOCK STRUCTURE DIE.

250 — REDUCE THE AIR PRESSURE INSIDE THE PACKAGE TO SUBSTANTIALLY LESS THAN THE AIR PRESSURE OUTSIDE OF THE PACKAGE.

252 — ATTACH A METAL LID TO THE PACKAGE AND FORM A PACKAGED CLOCK STRUCTURE CHIP THAT MAINTAINS THE REDUCED AIR PRESSURE INSIDE THE PACKAGE.

FIG. 2C

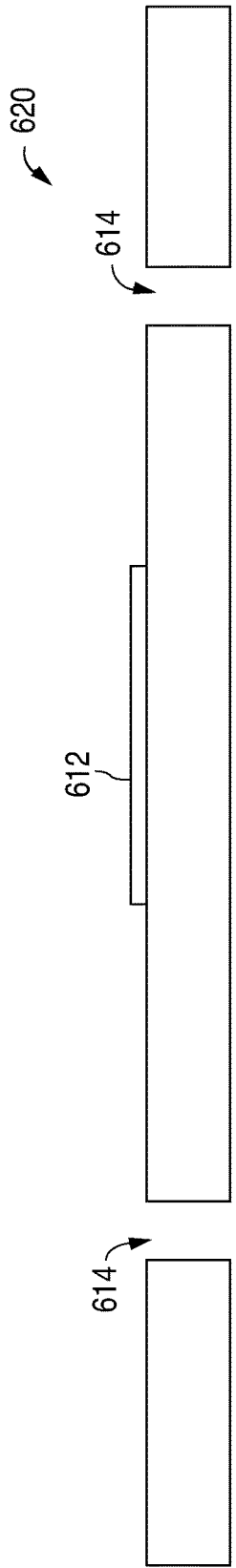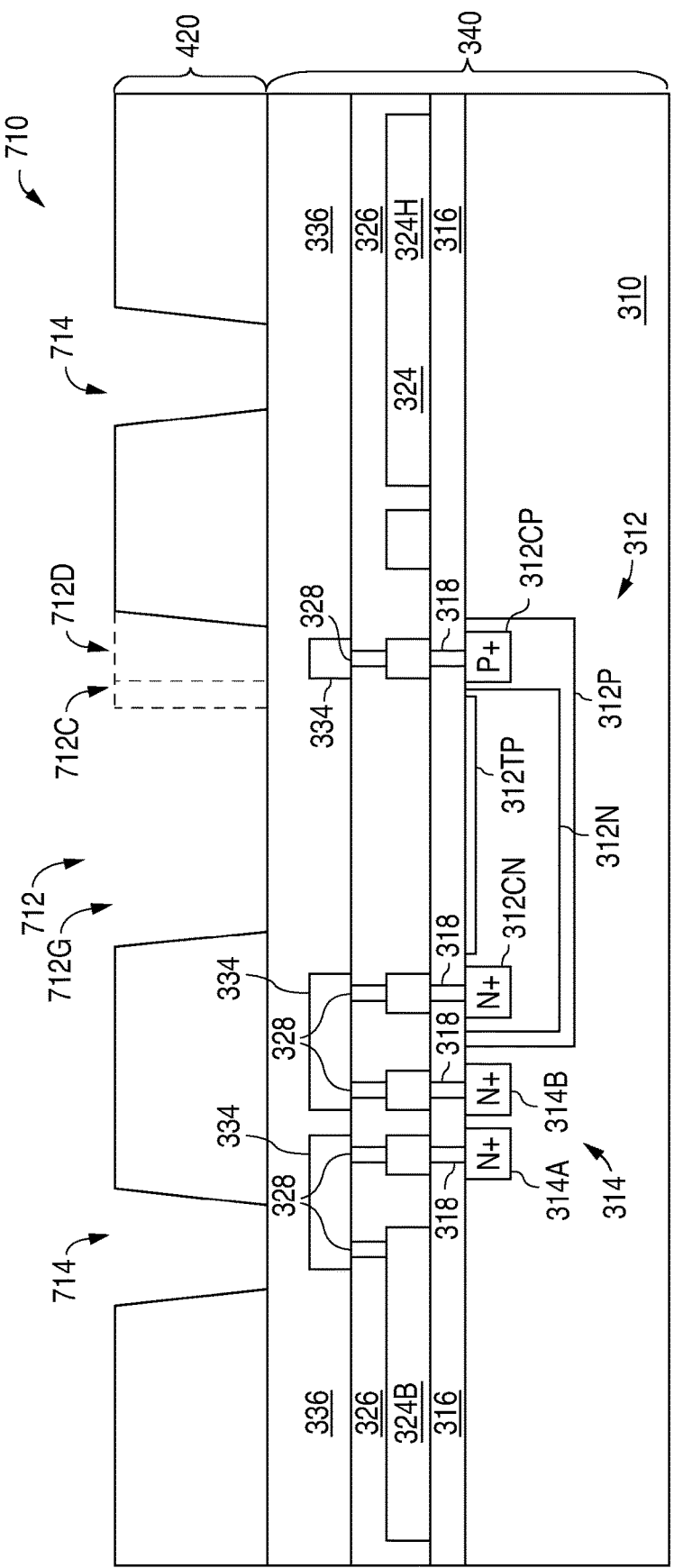
FIG. 6B
FIG. 7

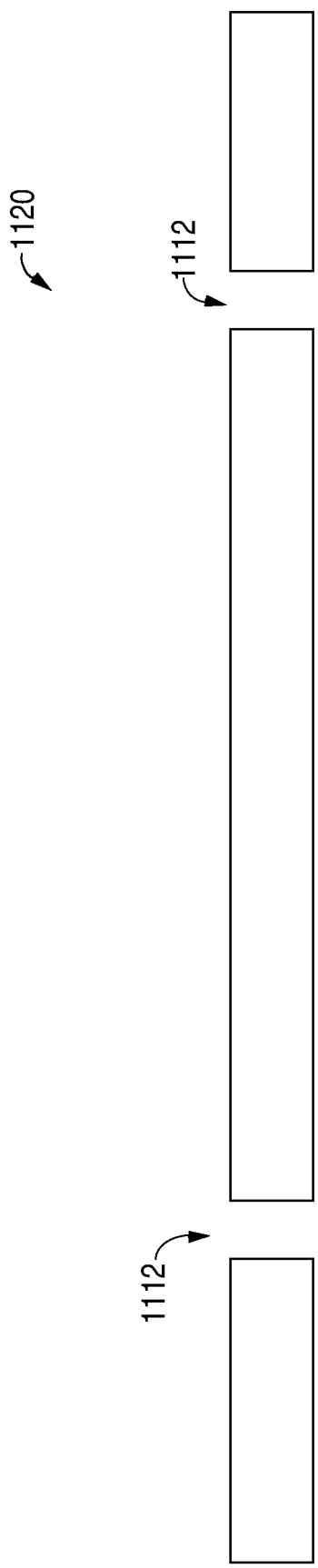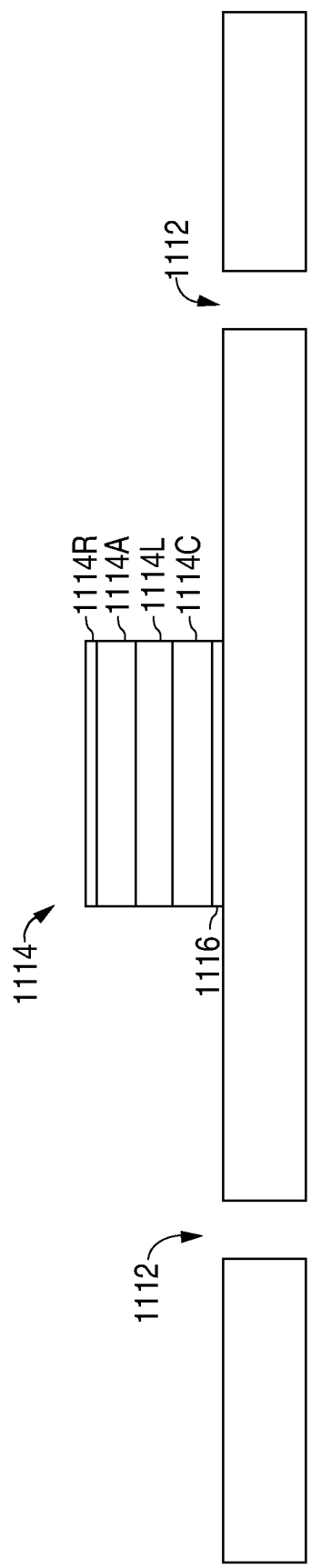

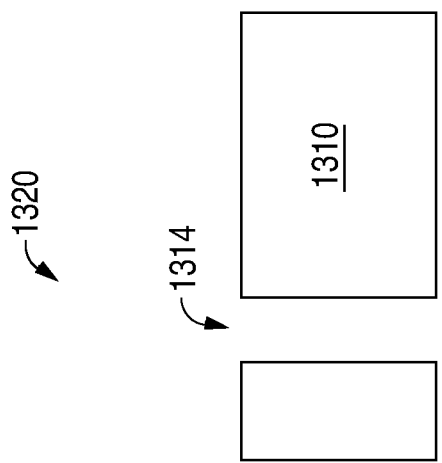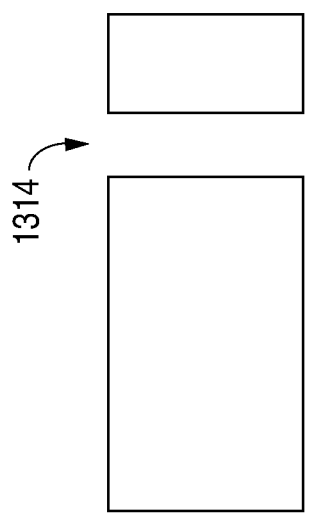
FIG. 13

MICRO-FABRICATED ATOMIC CLOCK STRUCTURE AND METHOD OF FORMING THE ATOMIC CLOCK STRUCTURE

This application is a divisional of U.S. patent application Ser. No. 13/345,688, filed Jan. 7, 2012 (now U.S. Pat. No. 9,024,397), the contents of all which are herein incorporated by reference in its entirety.

BACKGROUND OF THE INVENTION

1. Field of the Invention

The present invention relates to atomic clocks and, more particularly, to a thermally-insulated micro-fabricated atomic clock structure and a method of forming the atomic clock structure.

2. Description of the Related Art

A planar coil is a coil where each loop of the coil lies within the same plane. A current flowing in a planar coil generates a magnetic field that is perpendicular to the plane. When an object with a magnetic moment is placed in a magnetic field, the magnetic field exerts a force on the magnetic moment that tries to align the magnetic moment with the direction of the magnetic field.

Individual electrons have an intrinsic magnetic moment which can be thought of in the same manner as the magnetic moment that results from a current in a planar coil. As a result, when an electron is placed in a magnetic field, the magnetic field tries to align the intrinsic magnetic moment of the electron with the direction of the magnetic field.

Individual electrons also have an intrinsic angular momentum that is associated with the intrinsic magnetic moment. The interaction of the intrinsic angular momentum with the alignment force of the magnetic field causes the intrinsic magnetic moment of the electron to precess about the direction of the magnetic field. This precession is analogous to a spinning top as the top wobbles. The intrinsic magnetic moment of an electron precessing about the direction of an applied magnetic field is at an angular frequency known as the Larmor frequency.

The Larmor frequency can be used as a standard to maintain the frequency of a clock. The clock, which is commonly known as an atomic clock, oscillates at the Larmor frequency. In addition, the clock periodically determines the Larmor frequency, and uses the determined Larmor frequency to correct any drift in the oscillation frequency of the clock.

Atomic clocks which utilize the Larmor frequency as the frequency standard typically include a vapor cell, a vertical cavity surface emitting laser (VCSEL), and a photodiode. The vapor cell, which lies in an externally generated magnetic field, contains a gas that includes alkali atoms and buffer atoms.

Alkali atoms have a single electron in the outer s subshell of the atom. For example, rubidium[87] has a single electron in the 5 s subshell of the fifth shell, while cesium has a single electron in the 6 s subshell. In the absence of a magnetic field, the s subshell has two energy levels known as hyperfine energy levels. However, in the presence of a magnetic field, the subshell has a number of energy levels known as Zeeman sublevels within the hyperfine energy levels.

The alkali atoms within the gas are commonly implemented with, for example, [85]Rb atoms, [87]Rb atoms, K, or Cs atoms. The buffer atoms within the gas, which are utilized to reduce collisions between the alkali atoms and the inner surface of the vapor cell, are commonly implemented with, for example, $N_2$ atoms.

The light output by the VCSEL is tuned to a frequency which, when circularly polarized (and after having been linearly polarized by either a linear polarizing element or if the VCSEL is designed to produce linear polarized light), is absorbed by the single electrons in the outer shells of the alkali atoms in the gas. For example, the VCSEL can be tuned to output light with a wavelength of 794.8 nm which, after being circularly polarized, is absorbed by the single electrons in the outer shells of the [87]Rb atoms. The VCSEL can alternately be turned to output light with a wavelength of 894.35 nm which, after being circularly polarized, is absorbed by the single electrons in the outer shells of the Cs atoms.

If the single electron in the outer shell of an alkali atom absorbs right-hand circularly polarized light, then the electron transitions from the s subshell to either the outer p subshell, while the projection number M of the electron is always raised by +1. When the output light is removed, the single electron emits a photon in a random direction, and falls back to one of the Zeeman sublevels within the hyperfine energy levels of the s subshell. The state the electron falls to is exactly defined by the quantum selection rules.

When the electron falls back, the projection number M of the electron also changes by -1, 0, or +1 but in a random manner. Thus, when a number of such events occur to the same electron, each time the electron goes to a higher state, the projection number M of the electron is always raised by +1. However, as the electron falls down to the ground state, the projection number M of the electron on average does not change.

As a result, the electron will eventually land on the highest M level in the ground state. In the gasses under consideration, both the ground state $S_{1/2}$ and the elevated state $P_{1/2}$ (or $P_{3/2}$) have the same number for M levels. Thus, when the electron reaches the highest M level in the ground state, the electron cannot be pumped because there is not a higher M level in the excited state.

To again reabsorb light, the population in the ground state M levels has to be de-pumped. Additional energy (magnetic or optical) must be supplied to the electron at the Larmor frequency. The additional energy at the Larmor frequency causes the electron in the highest ground state M level to drop to a lower M level that is associated with the outer shell where the electron can again absorb light energy.

The photons that pass out of the vapor cell include a non-absorption component, which represents the light output by the VCSEL that was not absorbed by the electrons in the outer shell of the gas within the vapor cell, and an emission component, which represents the photons that are randomly emitted by the falling electrons. The photodiode detects these photons, and generates an output signal that has both a non-absorption component and an emission component.

One common approach to adding additional energy at the Larmor frequency is the Bell-Bloom (BB) technique. In the BB technique, the light output by the VCSEL is modulated by a frequency that is swept across a range of frequencies. When the light output by the VCSEL is frequency modulated at the Larmor frequency, the electrons drop to a lower energy level and begin reabsorbing light energy, which causes a noticeable dip in the intensity of light received by the photo detector.

Thus, the Larmor frequency can be determined by determining the modulated frequency that caused the intensity of the received light to dip. The detected Larmor frequency is then used to correct any drift in the frequency oscillation of the clock, thereby ensuring that the clock oscillates at the Larmor frequency.

Two of the drawbacks of conventional Larmor-based atomic clocks are size and cost, which then limit the types of applications where atomic clocks can be commercially utilized. In response to these drawbacks, micro-fabricated atomic clocks have been proposed which can be mass produced in conventional integrated circuit fabrication facilities.

However, many of the applications for micro-fabricated atomic clocks require the clock to operate with very little power in an environment where the external temperature can range from, for example, −40° C. to +100° C. This is difficult to achieve because the VCSEL and the gas within the vapor cell must each be heated to operate within specific temperature ranges to ensure proper operation.

Thus, there is a need for a micro-fabricated atomic clock which can operate with very little power in an environment where the external temperature can drop to −40° C., while at the same time maintaining the temperature required for the proper operation of the VCSEL and the gas within the vapor cell.

BRIEF DESCRIPTION OF THE DRAWINGS

FIGS. 2A-2C are a flow chart illustrating an example of a method 200 of forming a thermally-insulated micro-fabricated atomic clock structure in accordance with the present invention.

FIGS. 6A-6B are a series of cross-sectional views illustrating an example of a method of forming a lid wafer in accordance with the present invention.

FIG. 7 is a cross-sectional view illustrating an example of a method of forming an intermediate wafer in accordance with the present invention.

FIGS. 11A-11B are a series of cross-sectional views illustrating an example of a method of forming an optics structure in accordance with the present invention.

FIG. 13 is a cross-sectional view illustrating an example of a method of forming a spacer wafer in accordance with the present invention.

DETAILED DESCRIPTION OF THE INVENTION

Figure 1:
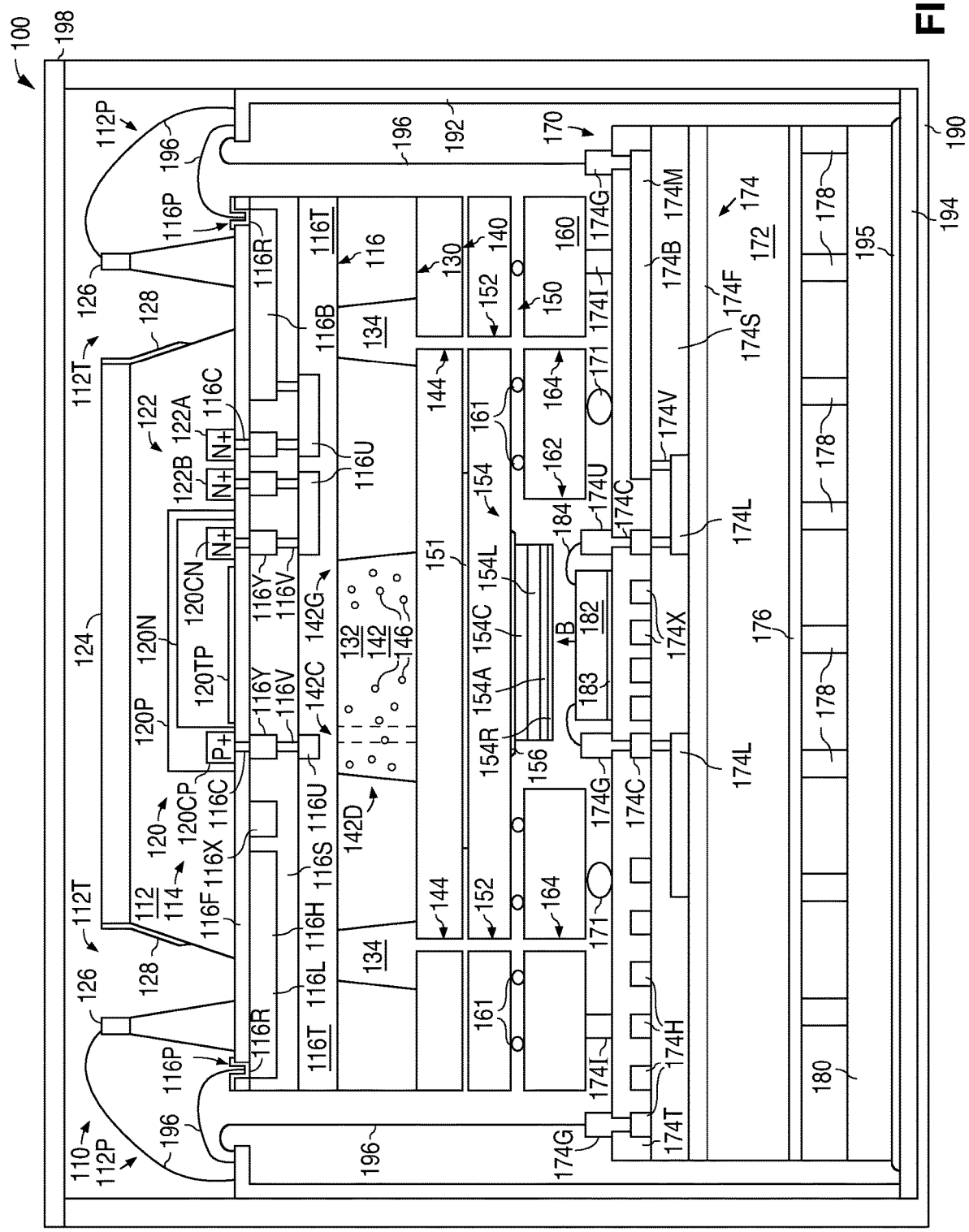
FIG. 1 is a block diagram illustrating an example of a thermally-insulated micro-fabricated atomic clock structure 100 in accordance with the present invention.

FIG. 1 shows a block diagram that illustrates an example of a thermally-insulated micro-fabricated atomic clock structure 100 in accordance with the present invention. As described in greater detail below, the present invention thermally insulates a micro-fabricated atomic clock structure so that the clock structure can operate with very little power in an environment where the external temperature can drop to −40° C., while at the same time maintaining the temperature required for the proper operation of the VCSEL and the gas within the vapor cell.

As shown in FIG. 1, clock structure 100 includes a photodiode structure 110 that has a substrate 112, a number of circuit elements 114 that lie within substrate 112, and a metal interconnect structure 116 that touches substrate 112. In the present example, substrate 112 is implemented with p− single-crystal silicon that has a device surface and an opposing non-device surface.

In addition, substrate 112 has a thermal barrier opening 112T and a peripheral opening 112P that each extends into substrate 112 from the non-device surface. In the present example, thermal barrier opening 112T and peripheral opening 112P each extend completely through substrate 112 to expose metal interconnect structure 116. Thus, in the present example, thermal barrier opening 112T laterally surrounds the number of circuit elements 114.

The number of circuit elements 114 include a photodiode 120 which has a p− well 120P that is formed in substrate 112, and an n-type region 120N that is formed in substrate 112 to lie within p− well 120P. In addition, photodiode 120 includes a p+ contact region 120CP that is formed in substrate 112 to lie within p− well 120P, and an n+ contact region 120CN that is formed in substrate 112 to lie within n-type region 120N.

Further, in the present example, photodiode 120 also includes a p+layer 120TP that is formed in substrate 112 to lie between n-type region 120N and the device surface of substrate 112. P+ layer 120TP is utilized to reduce surface recombination. P− well 120P has a dopant concentration that is greater than the dopant concentration of p− substrate 112, while p+ contact region 120CP has a dopant concentration that is greater than the dopant concentration of p− well 120P, and n+ contact region 120ON has a dopant concentration that is greater than the dopant concentration of n-type region 120N.

In the present example, the number of circuit elements 114 also includes transimpedance amplifier circuit elements 122 which, for purposes of simplicity, are represented as a pair of n+ regions 122A and 122B. In an alternate embodiment, the transimpedance amplifier circuit elements 122 are formed in a different substrate such that only photodiode 120 is formed in substrate 112.

Metal interconnect structure 116, in turn, includes a non-conductive layer 116F that touches the device surface of substrate 112, and a number of contacts 116C that extend through non-conductive layer 116F to make electrical connections to the number of circuit elements 114. Metal interconnect structure 116 further includes a number of metal-1 traces 116L that touch non-conductive layer 116F.

The metal-1 traces 116L include a heater trace 116H, a temperature sensor trace 116X, a number of contact traces 116Y that each touch a contact 116C, and a number of thermal bridge traces 116B. Only one thermal bridge trace 116B is shown for simplicity. Further, non-conductive layer 116F has bond pad openings 116P that expose bond pad regions 116R of heater trace 116H, temperature sensor trace 116X, and the thermal bridge traces 116B. As a result, the bond pad regions 116R of heater trace 116H, temperature sensor trace 116X, and the thermal bridge traces 116B are exposed by peripheral opening 112P.

Metal interconnect structure 116 additionally includes a non-conductive layer 116S that touches the non-conductive layer 116F and the metal-1 traces 116L, and a number of vias 116V that extend through non-conductive layer 116S to make electrical connections to the metal-1 traces 116L. Metal interconnect structure 116 also includes a number of metal-2 traces 116U that touch non-conductive layer 116S and the vias 116V, and a non-conductive layer 116T that touches non-conductive layer 116S and the metal-2 traces 116U. (Metal interconnect structure 116 can alternately include additional layers of metal traces.)

In the present example, the metal-1 traces 116L have a resistance that is greater than the resistance of the metal-2 traces 116U (and any additional layers of metal traces), and a thermal conductivity that is less than the thermal conductivity of the metal-2 traces 116U (and any additional layers of metal traces).

As further shown in FIG. 1, photodiode structure 110 additionally includes a metal plate 124 that touches the non-device surface of substrate 112, and a metal trace 126 that touches the non-device surface of substrate 112. Metal trace 126, which is spaced apart from metal plate 124, forms a coil that horizontally surrounds metal plate 124. (Metal trace 126 is illustrated with a single loop for simplicity. Additional loops can alternately be utilized.) Photodiode structure 110 can also optionally include a metal side wall cover 128 that touches metal plate 124 and substrate 112, and extends into thermal barrier opening 112T. In the present example, metal side wall cover 128 is spaced apart from metal interconnect structure 116.

Metal plate 124, metal trace 126, and metal side wall cover 128 are implemented with a metal that is a poor thermal radiator. For example, metal plate 124, metal trace 126, and metal side wall cover 128 can be implemented with a metal structure that includes copper, which is poor thermal radiator.

In operation, photodiode 120 receives light energy, and generates a current with a magnitude that varies with the intensity of the light energy. In the present example, a transimpedance amplifier, which is formed from the transimpedance amplifier circuit elements 122, receives the current and generates an amplified photodiode signal that is output by way of a thermal bridge trace 116B and the bond pad regions 116R of the thermal bridge trace 116B. (The current from photodiode 120 is directly output to the bond pad regions 116R when the transimpedance amplifier circuit elements 122 are optionally omitted.)

In addition, a current is input to metal trace 126 to generate a magnetic field. A current is also input as needed to heater trace 116H which, by the resistance of heater trace 116H, generates heat. Further, a current is input as needed to temperature sensor trace 116X to measure the temperature adjacent to heater trace 116H. The resistivity of temperature sensor trace 116X varies in response to the temperature.

In the present example, thermal barrier opening 112T, heater trace 116H, temperature sensor trace 116X, the thermal bridge traces 116B, metal plate 124, and metal side wall cover 128 provide thermal insulation that retains the heat generated by heater trace 116H. The heat which would radiate out from the non-device surface of substrate 112 is substantially reduced by metal plate 124 because metal plate 124 includes a metal, such as copper, which is a poor radiator of heat.

Further, the heat which would radiate out laterally from substrate 112 is substantially reduced by thermal barrier opening 112T and metal side wall cover 128. As further described below, the air pressure within thermal barrier opening 112T and peripheral opening 112P is less than an outside atmospheric pressure. Less heat radiates out into thermal barrier opening 112T as the air pressure is reduced. In addition, metal side wall cover 128 further reduces lateral heat loss from substrate 112 because metal side wall cover 128 includes a metal, such as copper, that is a poor radiator of heat.

Further, the only metal traces that extend out to the periphery to be electrically connected to a metal lead frame are heater trace 116H, temperature sensor trace 116X, and the thermal bridge traces 116B. Thus, the heat which would conduct laterally outward from the aluminum traces conventionally used in a metal interconnect structure is substantially reduced by heater trace 116H, temperature sensor trace 116X, and the thermal bridge traces 116B because heater trace 116H, temperature sensor trace 116X, and the thermal bridge traces 116B are formed from a metal, such as a refractory metal, which is a poor conductor of heat.

As additionally shown in FIG. 1, clock structure 100 includes a vapor cell structure 130 that touches metal interconnect structure 116. Vapor cell structure 130 has a vapor cell opening 132 and a thermal barrier opening 134. Both openings 132 and 134 extend completely through vapor cell structure 130, while thermal barrier opening 134 horizontally surrounds vapor cell opening 132. Metal interconnect structure 116, in turn, fully closes one end of vapor cell opening 132 and one end of thermal barrier opening 134.

Clock structure 100 further includes a lid structure 140 that touches vapor cell structure 130 to close and hermetically seal vapor cell opening 132 to form a vapor cell 142. Vapor cell 142, in turn, has a gas region 142G, a deposition region 142D, and a channel region 142C that links deposition region 142D to gas region 142G. Channel region 142C is thin enough to prevent an aqueous solution from flowing from deposition region 142D to gas region 142G, but wide enough to allow a gas to flow from deposition region 142D to gas region 142G. In addition, lid structure 140 has an access opening 144 that extends completely through lid structure 140 to expose thermal barrier opening 134.

Clock structure 100 additionally includes a gas 146 that lies within vapor cell 142. In the present example, gas 146 includes alkali atoms and buffer atoms. The alkali atoms within gas 146 can be implemented with, for example, $^{85}$Rb atoms, $^{87}$Rb atoms, K, or Cs atoms. The buffer atoms within gas 146 can be implemented with, for example, N2 atoms.

In operation, light from a light source is directed into vapor cell 142 where the light energy is absorbed by alkali atoms in gas 146. Proper operation requires that gas 146 within vapor cell 142 be heated to lie within a temperature range. The heat required by gas 146 is provided by heater trace 116H.

In addition, thermal barrier opening 134 and access opening 144 provide thermal insulation that retains the heat generated by heater trace 116H. The heat which would radiate out from vapor cell 142 is substantially reduced by thermal barrier opening 134 and access opening 144. As further described below, the air pressure within thermal barrier opening 134 and access opening 144 is less than an outside atmospheric pressure. Less heat radiates out into thermal barrier opening 134 and access opening 144 as the air pressure is reduced.

Clock structure 100 also includes an optics structure 150 that is attached to lid structure 140 with a conventional die attach material 151. Optics structure 150 has an access opening 152 that extends completely through optics structure 150 to expose thermal barrier opening 134 and access opening 144. Clock structure 100 further includes an optics package 154 that is attached to optics structure 150 with a conventional die attach material 156.

Optics package 154, in turn, includes an attenuator 154A that reduces the intensity of the input light, a linear polarizer 154L that linearly polarizes the light output from attenuator 154A, and a quarter wave plate circular polarizer 154C that circularly polarizes the light output from linear polarizer 154L. Attenuator 154A, in turn, has an outer surface covered with a non-reflective coating 154R.

In addition, clock structure 100 includes a spacer structure 160 that is attached to optics structure 150 with blobs 161 of a conventional die attach material. Spacer structure 160 has an optical opening 162 and an access opening 164 that both extend completely through spacer structure 160. Optics package 154 lies within optical opening 162 of spacer structure 160, while access opening 164 exposes thermal barrier opening 134 and access opening 144.

As also shown in FIG. 1, clock structure 100 includes a vertical cavity surface emitting laser (VCSEL) support structure 170 that is attached to spacer structure 160 with blobs 171 of a conventional die attach material. VCSEL support structure 170 has a substrate 172 and a metal interconnect structure 174 that touches substrate 172. In the present example, substrate 172 is implemented with glass that has an interconnect surface and an opposing non-interconnect surface.

Metal interconnect structure 174, in turn, includes a non-conductive layer 174F that touches the interconnect surface of substrate 172, and a number of metal-1 traces 174L that touch non-conductive layer 174F. Metal interconnect structure 174 also includes a non-conductive layer 174S that touches non-conductive layer 174F and the metal-1 traces 174L, and a number of vias 174V that extend through non-conductive layer 174S to make electrical connections with the metal-1 traces 174L.

In addition, metal interconnect structure 174 includes a number of metal-2 traces 174M that touch non-conductive layer 174S. The metal-2 traces 174M include a heater trace 174H, a temperature sensor trace 174X, a number of thermal bridge traces 174B (only one is shown for simplicity), and a number of contact traces 174C that each touch a via 174V.

Metal interconnect structure 174 also includes a non-conductive layer 174T that touches non-conductive layer 174T and the metal-2 traces 174M.

In addition, metal interconnect structure 174 includes a number of metal-3 traces 174U that touch non-conductive layer 174T. The metal-3 traces 174U include a number of contact traces 174G that have via sections that extend down through non-conductive layer 174T to touch the ends of the metal-2 heater trace 174H, the ends of the metal-2 temperature sensor trace 174X, and an end of each thermal bridge traces 174B. In addition, the metal-3 traces 174 include a coil trace 174I that is laid out as a planar coil. (The planar coil is illustrated with a single loop for simplicity. Additional loops can alternately be used to increase the magnetic field.)

In the present example, the metal-1 traces 174L and the metal-3 traces 174U include metals which have a resistance that is lower than the resistance of the metal-2 traces 174M. In addition, the metal-1 traces 174L have a thermal conductivity that is greater than the thermal conductivity of the metal-2 traces 174M. For example, the metal-2 traces 174M can be formed from a refractory metal, such as tungsten, titanium, cobalt, zirconium, or molybdenum, while the metal-1 traces 174L can be formed from a metal such as aluminum and the metal-3 traces 174U can include copper.

In addition, VCSEL support structure 170 has a metal plate 176 that touches the non-interconnect surface of substrate 172, a number of pillars 178 that touch metal plate 176, and a lattice structure 180 that touches the pillars 178. The pillars 178 are non-conductive and spaced apart from each other, while lattice structure 180, which is non-conductive, has a number of openings that extend completely through lattice structure 180.

As further shown in FIG. 1, clock structure 100 has a VCSEL 182 that outputs a laser light beam B. VCSEL 182 is attached to non-conductive layer 174T of metal interconnect structure 174 with a conventional die attach material 183. Clock structure 100 also includes a number of bonding wires 184 that are attached to VCSEL 182 and a number of the contact traces 174G that are associated with VCSEL 182.

In operation, a current is input to coil trace 174I to generate a magnetic field. A current is also input as needed to heater trace 174H which, by the resistance of heater trace 174H, generates heat. Further, a current is input as needed to temperature sensor trace 174X to measure the temperature adjacent to heater trace 174H. The resistivity of temperature sensor trace 174X varies in response to the temperature.

In addition, the laser beam B output by VCSEL 182 is directed into vapor cell 142 where alkali atoms in vapor cell 142 absorb light energy from the laser beam B. In the alkali atoms that absorb light energy, the single electron in the outer shell transitions from the 1s subshell to either the 2 s or 2p subshell. When the light energy is removed, the single electron emits a photon in a random direction, and falls back to one of the Zeeman sublevels within the hyperfine energy levels of the 1s subshell.

When alkali atoms are no longer capable of transitioning from the 1s subshell to either the 2s or 2p subshell, additional optical energy is supplied to the electrons at the Larmor frequency by sweeping a modulated frequency across a range of frequencies. When the light output by VCSEL 182 is frequency modulated at the Larmor frequency, the electrons drop to a lower energy level and begin reabsorbing light energy, which causes a noticeable dip in the intensity of light received by photodiode 120.

Proper operation requires that VCSEL 182 be heated to lie within a temperature range. The heat required by VCSEL 182 is provided by heater trace 174H. In addition, metal plate 176, the pillars 178, and lattice structure 180 provide thermal insulation that retains the heat generated by heater trace 174H. The heat which would radiate out the non-interconnect surface of substrate 172 is substantially reduced by metal plate 176 because metal plate 176 includes a metal, such as copper, which is a poor radiator of heat.

In addition, as further described below, the air pressure between the pillars 178 is less than an outside atmospheric pressure. Less heat radiates out past lattice structure 180 as the air pressure is reduced. In addition, the only metal traces that extend out to the periphery to make electrical connections with the metal-3 contact traces 174G are heater trace 174H, temperature sensor trace 174X, and the thermal bridge traces 174B.

Thus, the heat which would conduct laterally outward from the aluminum traces conventionally used in a metal interconnect structure is substantially reduced by heater trace 174H, temperature sensor trace 174X, and the thermal bridge traces 174B because heater trace 174H, temperature sensor trace 174X, and the thermal bridge traces 174B are formed from a metal, such as a refractory metal, which is a poor conductor of heat.

As further shown in FIG. 1, clock structure 100 has a package structure 190, a metal lead frame 192 that is connected to package structure 190, and a die attach pad (DAP) 194 that is connected to metal lead frame 192. Lattice structure 180, in turn, is attached to DAP 194 with a conventional die attach material 195.

Clock structure 100 also has a number of bonding wires 196 that are connected to metal lead frame 192 and metal trace 126, the bond pad regions 116R, and the contact traces 174G. Clock structure 100 further has a metal lid 198 that is attached to package structure 190 to close and hermetically seal the inside of package structure 190 to have an internal air pressure that is substantially less than the air pressure outside of package structure 190.

One of the advantages of clock structure 100 is that clock structure 100 thermally insulates heater traces 116H and 174H, thereby substantially reducing the heat that is lost. As a result, clock structure 100 can operate with very little power in an environment where the external temperature can drop to −40° C., while at the same time maintaining the temperature required for the proper operation of vapor cell 142 and VCSEL 182.

Figure 2B:
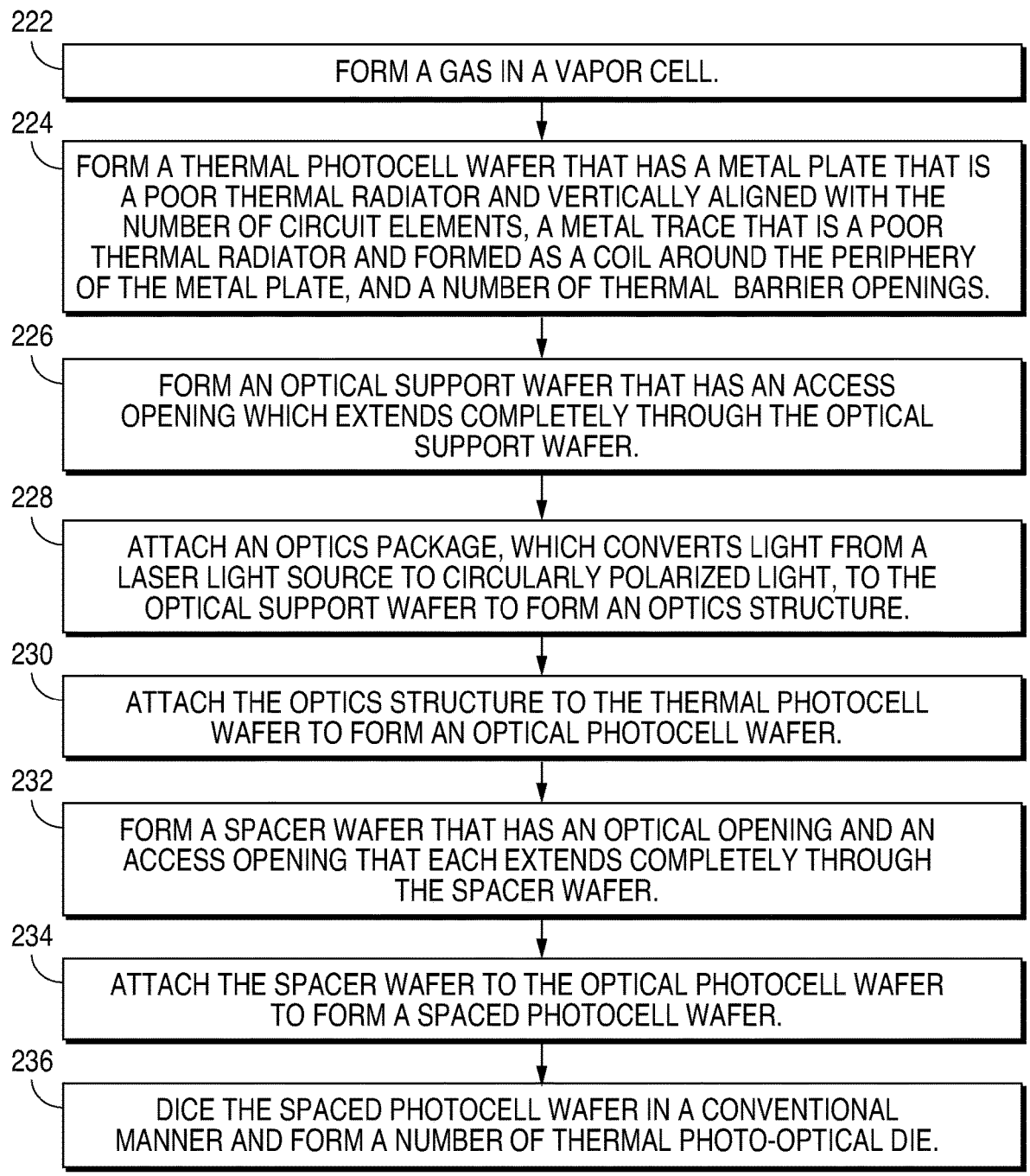

FIGS. 2A-2C show a flow chart that illustrates an example of a method 200 of forming a thermally-insulated microfabricated atomic clock structure in accordance with the present invention. As shown in FIGS. 2A-2C, method 200 begins at 210 by forming a photodiode wafer that has a substrate, a number of circuit elements that lie within the substrate, and a metal interconnect structure that touches the substrate.

The metal interconnect structure, which is electrically connected to the number of circuit elements, has a number of metal-1 traces and a number of metal-2 traces. The metal-2 traces have a thermal conductivity that is greater than the thermal conductivity of the metal-1 traces, and a resistance that is less than the resistance of the metal-1 traces.

Figure 3A:
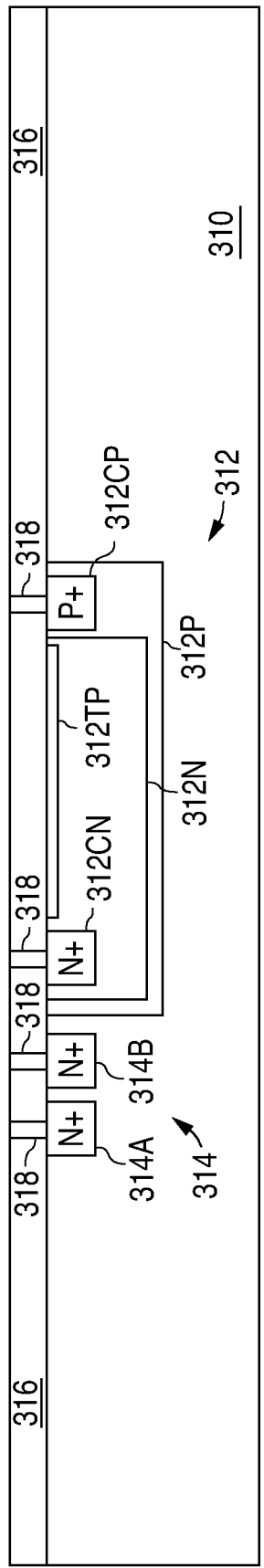
FIGS. 3A-3G are a series of cross-sectional views illustrating an example of a method of forming a photodiode wafer in accordance with the present invention.

FIGS. 3A-3G show a series of cross-sectional views that illustrate an example of a method of forming a photodiode wafer in accordance with the present invention. As shown in FIG. 3A, the method utilizes a conventionally formed p− single-crystal silicon wafer 310 approximately 600 µm thick. Silicon wafer 310 has a device surface, an opposing non-device surface, and rows and columns of identical die regions. Only one die region is shown and discussed for simplicity.

As further shown in FIG. 3A, the method begins by forming a number of circuit elements 311 that lie within silicon wafer 310 in a conventional manner. The number of circuit elements 311 include a photodiode 312 which has a p− well 312P that is formed in silicon wafer 310, and ann-type region 312N that is formed in silicon wafer 310 to lie within p− well 312P. In addition, photodiode 312 includes a p+ contact region 312CP that is formed in silicon wafer 310 to lie within p− well 312P, and ann+ contact region 312CN that is formed in silicon wafer 310 to lie within n-type region 312N.

Further, in the present example, photodiode 312 also includes a p+ layer 312TP that is formed in silicon wafer 310 to lie between n-type region 312N and the device surface of silicon wafer 310. P+ layer 312TP is utilized to reduce surface recombination. P− well 312P has a dopant concentration that is greater than the dopant concentration of p− single-crystal silicon wafer 310, while p+ contact region 312CP has a dopant concentration that is greater than the dopant concentration of p− well 312P, and n+ contact region 312CN has a dopant concentration that is greater than the dopant concentration of n-type region 312N.

In the present example, the number of circuit elements 311 also includes transimpedance amplifier circuit elements 314. The transimpedance amplifier circuit elements 314 are well known and represented as a pair of n+ regions 314A and 314B for simplicity. In an alternate embodiment, the transimpedance amplifier circuit elements 314 are formed in a different substrate such that only photodiode 312 is formed in silicon wafer 310.

Following the conventional formation of photodiode 312 and the transimpedance amplifier circuit elements 314, a layer of oxide 316 is formed in a conventional manner on the device surface of silicon wafer 310 to lie over photodiode 312 and the transimpedance amplifier circuit elements 314.

After this, a number of metal contacts 318 are formed in a conventional manner to extend through oxide layer 316 and make electrical connections with the number of circuit elements 311. In the present example, the contacts 318 make electrical connections top+ contact region 312CP and n+ contact region 312CN of photodiode 312, and the n+ regions 314A and 314B of the circuit elements 314. The to-be-contacted regions, such as p+ contact region 312CP and n+ contact region 312CN of photodiode 312, and then+ regions 314A and 314B of the circuit elements 314, can optionally be silicided after oxide layer 316 has been formed and before the contacts 318 are formed.

Figure 3B:
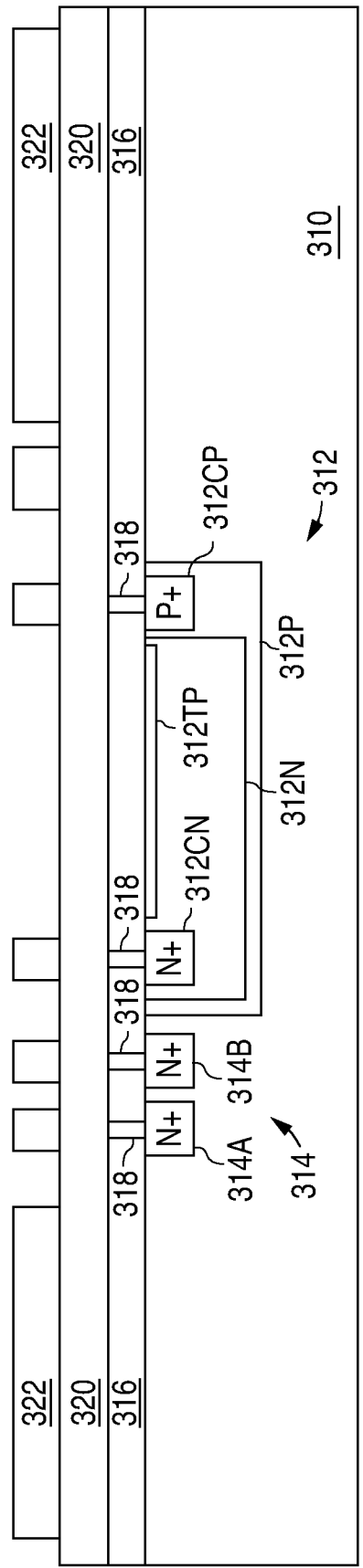

As shown in FIG. 3B, following the conventional formation of the contacts 318, a layer of metal 320 is deposited to touch oxide layer 316 and the contacts 318. Once metal layer 320 has been deposited, a patterned photoresist layer 322 is formed on metal layer 320 in a conventional manner.

Figure 3C:
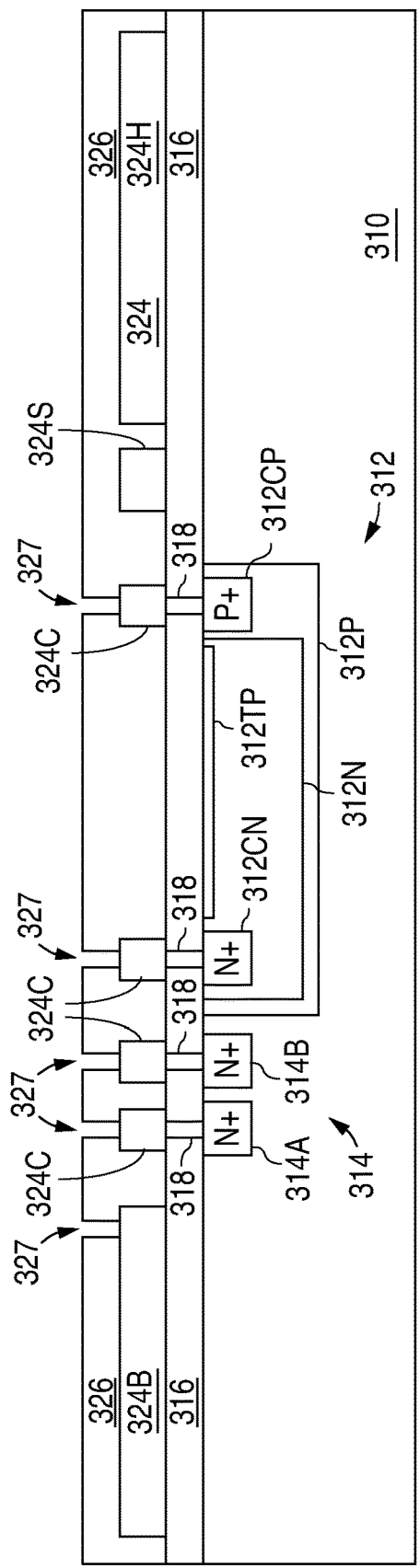

As shown in FIG. 3C, after patterned photoresist layer 322 has been formed, the exposed regions of metal layer 320 are etched to form a number of metal-1 traces 324. The metal-1 traces 324, which each lie in a plane P1, include a heater trace 324H, a temperature sensor trace 324S, a number of contact traces 324C that each touch a contact 318, and a number of thermal bridge traces 324B. Only one thermal bridge trace 324B is shown for simplicity.

Heater trace 324H has opposite ends that both lie in the periphery of the die region. Similarly, temperature sensor trace 324S also has opposite ends that both lie in the periphery of the die region. In addition, the thermal bridge traces 324B each have an end that lies in the periphery of the die region.

Heater trace 324H can be laid out to minimize the magnetic field that is generated by current flowing through heater trace 324H. For example, heater trace 324H can be laid out with long parallel strips with alternate strip ends connected together to form a serpentine pattern. Similarly, temperature sensor trace 324S can be laid out to minimize the magnetic field that is generated by current flowing through temperature sensor trace 324S.

For example, temperature sensor trace 324S can be laid out in two long parallel strips with one pair of strip ends connected together to form a long U-shape pattern. Once the metal-1 traces 324 have been formed, patterned photoresist layer 322 is removed in a conventional manner. For example, patterned photoresist layer 322 can be removed with acetone, followed by a cleaning, such as with a conventional Piranha etch, to remove organics.

Figure 3D:
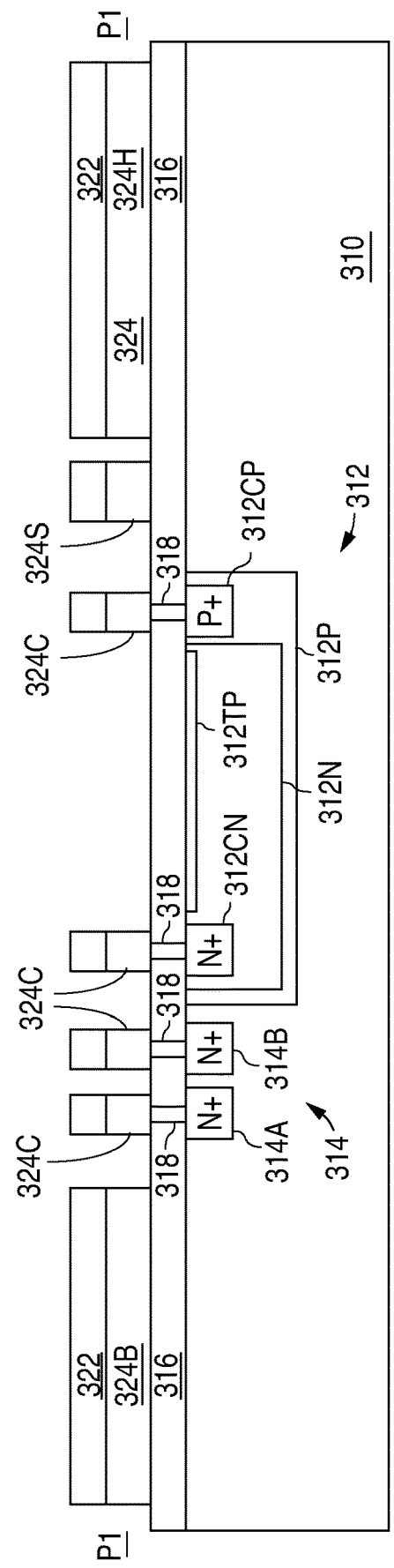

As shown in FIG. 3D, a layer of oxide 326 is next formed on oxide layer 316 and the metal-1 traces 324. A number of openings 327 are then formed in oxide layer 326 using a patterned photoresist layer and an etch to expose selected regions of the thermal bridge traces 324B and the contact traces 324C.

Figure 3E:
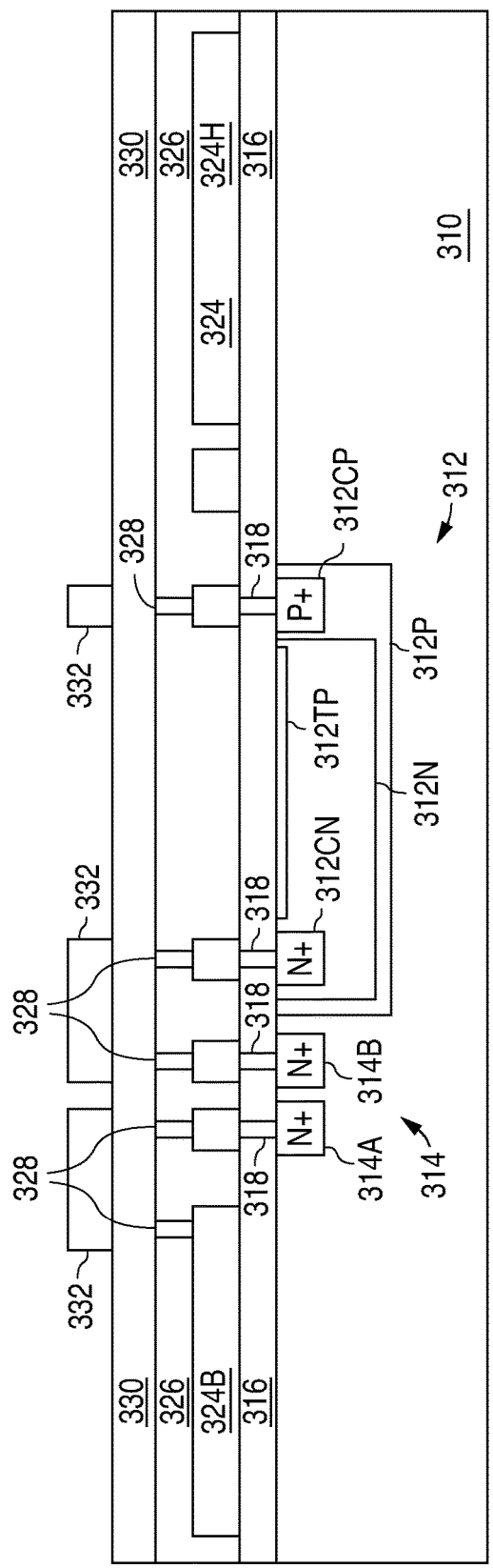

Following this, as shown in FIG. 3E, a metal layer is deposited, and then planarized to remove the metal layer from the outer surface of oxide layer 326 and form vias 328 in the openings 327. The vias 328 touch the thermal bridge traces 324B and the contact traces 324C. Once the vias 328 have been formed, a layer of metal 330 is deposited onto oxide layer 326 and the vias 328. Next, a patterned photoresist layer 332 is formed on metal layer 330 in a conventional manner.

Figure 3F:
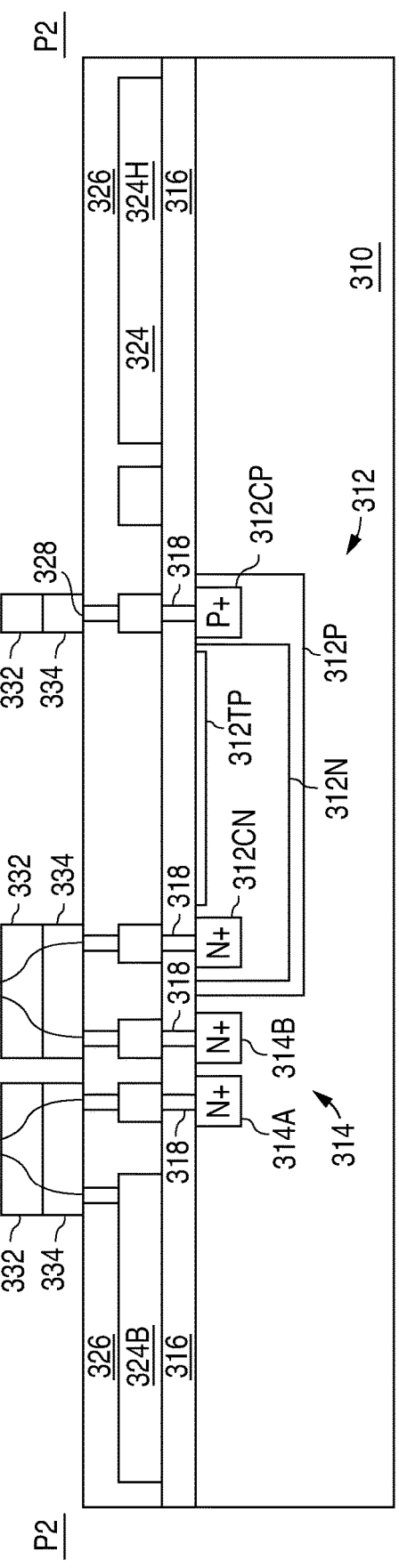

As shown in FIG. 3F, after patterned photoresist layer 332 has been formed, the exposed regions of metal layer 330 are etched to form a number of metal-2 traces 334. The metal-2 traces 334, which each lie in a plane P2 that lies over and substantially parallel to plane P1, are connected to the vias 328. In the present example, metal layer 330 is formed from a metal which has a lower resistance and a higher thermal conductivity than the metal that is used to form metal layer 320.

For example, metal layer 320 can be formed from a refractory metal, such as tungsten, titanium, cobalt, zirconium, or molybdenum (which remain stable at temperatures above 450° C., the melting point of aluminum), while metal layer 330 can be formed from a metal such as aluminum. As a result, the metal-1 traces 324 have a higher resistance and a lower thermal conductivity than the metal-2 traces 334. Once the metal-2 traces 334 have been formed, patterned photoresist layer 332 is removed in a conventional manner.

Figure 3G:
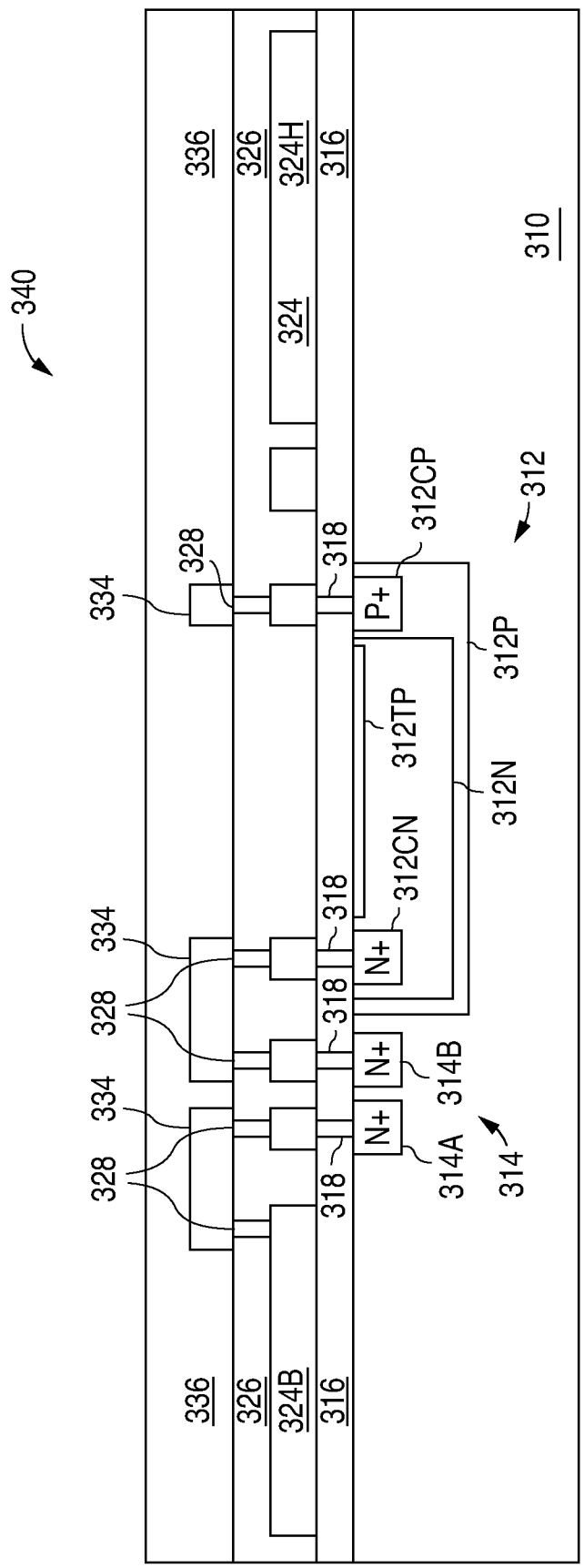

As shown in FIG. 3G, a layer of oxide 336 is next formed on oxide layer 326 and the metal-2 traces 334 in a conventional manner. Oxide layer 336 is then planarized in a conventional manner, such as with chemical-mechanical polishing, until the top surface of oxide layer 336 is flat enough for wafer level fusion bonding. Completion of the planarization completes the formation of a photodiode wafer 340. (Additional layers of metal traces that each has a lower resistance and a higher thermal conductivity than the metal-1 traces 324 can alternately be formed.)

Referring again to FIGS. 2A-2C, after the photodiode wafer has been formed, method 200 moves to 212 to form a vapor cell wafer. The vapor cell wafer has a vapor cell opening and a thermal barrier opening that each extend completely through the vapor cell wafer. The thermal barrier opening, which is spaced apart from the vapor cell opening, laterally surrounds the vapor cell opening.

Figure 4A:
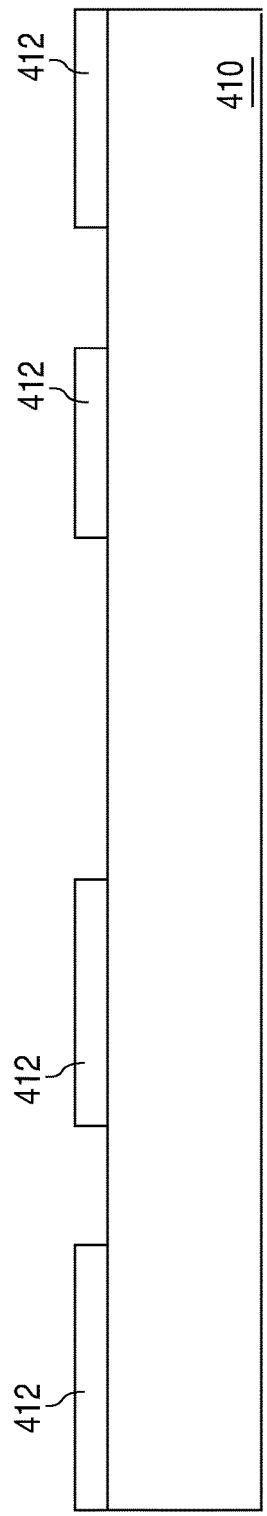
FIGS. 4A-4C are a series of cross-sectional views illustrating an example of a method of forming a vapor cell wafer in accordance with the present invention.
Figure 4B:
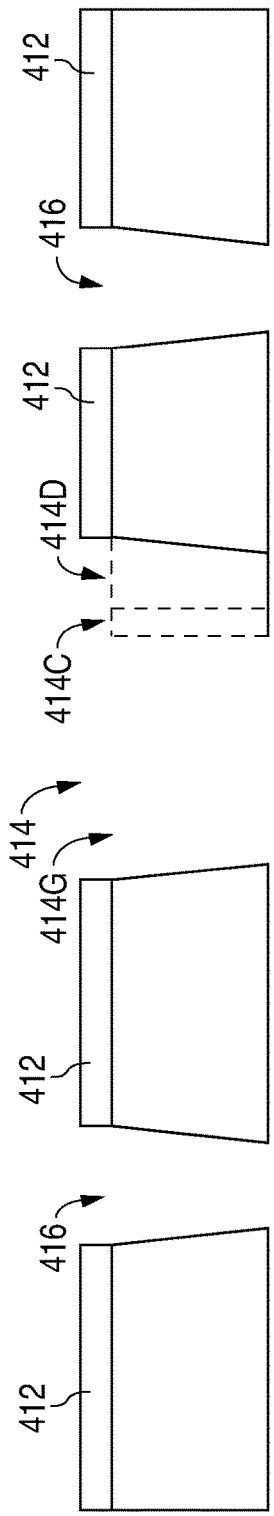
Figure 4C:
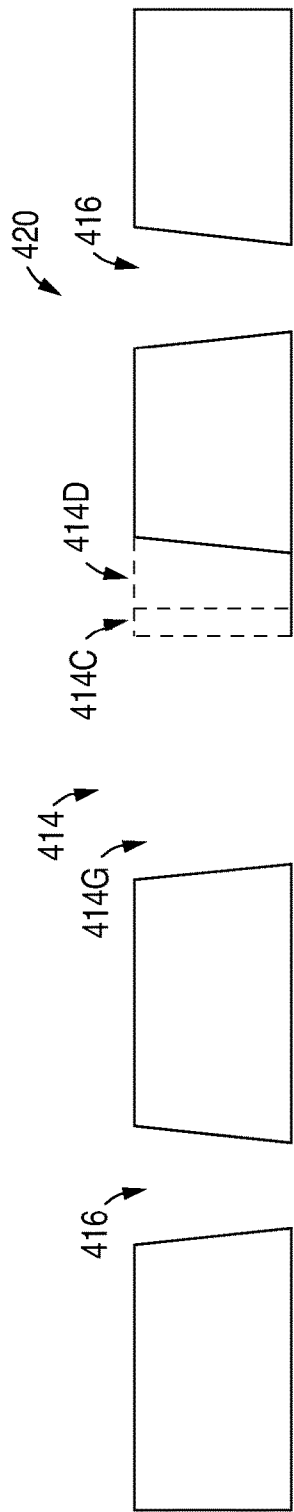

FIGS. 4A-4C show a series of cross-sectional views that illustrate an example of a method of forming a vapor cell wafer in accordance with the present invention. As shown in FIG. 4A, the method utilizes a conventionally formed p− single-crystal silicon wafer 410 approximately 1 mm thick. Silicon wafer 410 has rows and columns of identical die regions. Only one die region is shown and discussed for simplicity.

As shown in FIG. 4A, the method begins by forming a hard mask 412 on silicon wafer 410 in a conventional manner. After hard mask 412 has been formed, as shown in FIG. 4B, the exposed regions of silicon wafer 410 are etched to form a vapor cell opening 414 and a thermal barrier opening 416 that each extends completely through silicon wafer 410.

Vapor cell opening 414, in turn, has a gas region 414G, a deposition region 414D, and a channel region 414C that links deposition region 414D to gas region 414G. Following this, as shown in FIG. 4C, hard mask 412 is removed in a conventional manner to complete the formation of a vapor cell wafer 420.

Figure 5:
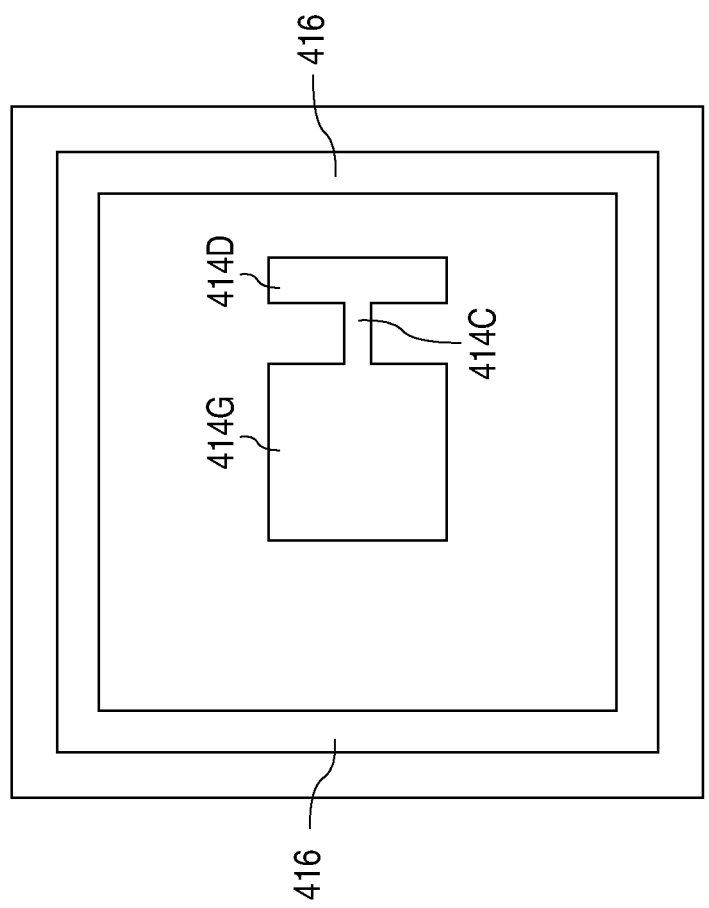
FIG. 5 is a plan view further illustrating vapor cell wafer 420 in accordance with the present invention.

FIG. 5 shows a plan view that further illustrates vapor cell wafer 420 in accordance with the present invention. As shown in FIG. 5, channel region 414C is thin enough to prevent an aqueous solution from flowing from deposition region 414D to gas region 414G, but wide enough to allow a gas to flow from deposition region 414D to gas region 414G. Other opening shapes can alternately be used.

Referring again to FIGS. 2A-2C, after the vapor cell wafer has been formed, method 200 moves to 214 to form a lid wafer. The lid wafer has an access opening that extends completely through the lid wafer, and an ionic barrier structure that provides a barrier to the diffusion of impurity ions.

Figure 6A:
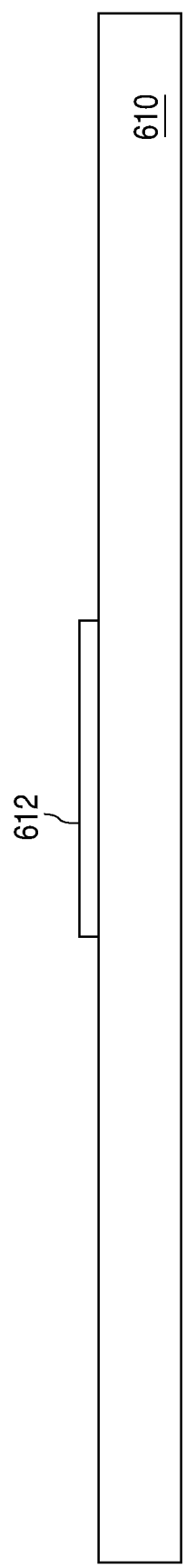

FIGS. 6A-6B show a series of cross-sectional views that illustrate an example of a method of forming a lid wafer in accordance with the present invention. As shown in FIG. 6A, the method utilizes a conventionally formed transparent wafer 610 approximately 500 μm thick that has rows and columns of identical die regions. Only one die region is shown and discussed for simplicity.

In the present example, transparent wafer 610 is implemented with glass that has an ionic impurity, such as sodium ions, that makes the glass suitable for anodic bonding to single-crystal silicon. For example, Pyrex® by Corning or Schott Borofloat 33® by Schott is a glass product which can be utilized.

As further shown in FIG. 6A, the method begins by forming an ionic barrier structure 612 on the surface of transparent wafer 610. In the present example, ionic barrier structure 612 is formed by depositing a layer of nitride, followed by the conventional formation of a patterned photoresist layer. After the patterned photoresist layer has been formed, the exposed regions of the nitride layer are etched away to leave ionic barrier structure 612. Following this, the patterned photoresist layer is removed in a conventional manner.

As shown in FIG. 6B, once ionic barrier structure 612 has been formed, an access opening 614 that extends completely through transparent wafer 610 is formed in a conventional manner. Completion of the formation of access opening 614 completes the formation of a lid wafer 620.

Referring again to FIGS. 2A-2C, after the lid wafer has been formed, method 200 moves to 216 to attach the vapor cell wafer to the photodiode wafer and form an intermediate wafer. The intermediate wafer has a vapor cell cavity and a thermal barrier cavity, which are formed by the photodiode wafer closing one side of the vapor cell opening and one side of the thermal barrier opening. The vapor cell cavity, in turn, includes a gas region, a channel region, and a deposition region.

FIG. 7 shows a cross-sectional view that illustrates an example of a method of forming an intermediate wafer in accordance with the present invention. As shown in FIG. 7, the method fusion bonds vapor cell wafer 420 to photodiode wafer 340 in a conventional manner. Completion of the bonding of vapor cell wafer 420 to photodiode wafer 340 completes the formation of an intermediate wafer 710 that has a vapor cell cavity 712 and a thermal barrier cavity 714. Vapor cell cavity 712, in turn, includes a gas region 712G, a channel region 712C, and a deposition region 712D.

Referring back to FIGS. 2A-2C, after the intermediate wafer has been formed, method 200 moves to 218 to place a substance which can be decomposed by ultraviolet (UV) light into alkali and barrier atoms into the vapor cell cavity. In the present example, the substance is placed into the vapor cell cavity by first dissolving cesium azide ($CsN_3$) into water to form an aqueous solution, and then placing a measured amount of the solution (e.g., 10 µL) into the deposition region at room temperature using, for example, micro-pipettes.

The channel region, in turn, is thin enough to prevent the aqueous solution from flowing into the gas region. After the aqueous solution has been placed into the deposition region, the intermediate wafer is heated to evaporate away the water and leave a cesium azide solid residue in the deposition region.

After the substance has been placed into the vapor cell cavity, method 200 moves to 220 to attach the lid wafer to the intermediate wafer and form a photocell wafer that has a hermetically sealed vapor cell and an exposed thermal barrier opening.

Figure 8:
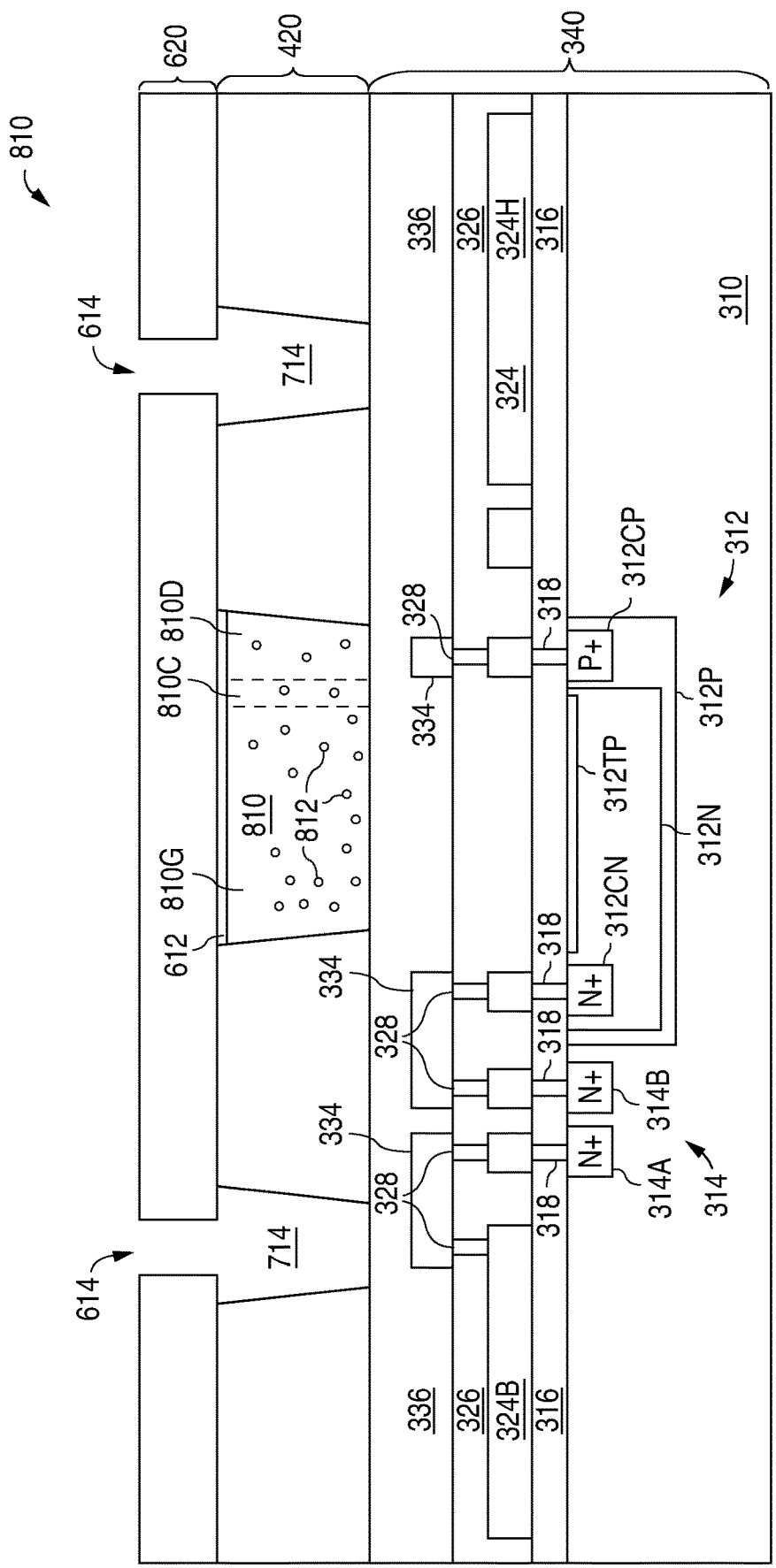
FIG. 8 is a cross-sectional view illustrating an example of a method of forming a photocell wafer in accordance with the present invention.

FIG. 8 shows a cross-sectional view that illustrates an example of a method of forming a photocell wafer in accordance with the present invention. As shown in FIG. 8, the method anodically bonds lid wafer 620 to vapor cell wafer 420 of intermediate wafer 710 in a conventional manner to form a photocell wafer 810.

Cesium azide is unstable at 400° C., and diffuses into glass at 350° C. As a result, the anodic bonding is performed in a conventional manner at a reduced temperature, such as 300° C., and in a noble gas environment, such as nitrogen gas, with increased bonding time. A reduced temperature requires a higher voltage. However, a thinner wafer requires a lower voltage. As a result, a standard voltage of 1000V can be used.

The anodic bonding process closes the top of vapor cell cavity 712 to form a hermetically sealed vapor cell 810. Vapor cell 810, in turn, includes a gas region 810G, a channel region 810CC, and a deposition region 810D. In the present example, the cesium azide powder is hermetically sealed only within deposition region 810D. Further, after the wafers have been bonded together, access opening 614 exposes thermal barrier opening 714 to form an exposed thermal barrier opening. In addition, ionic barrier structure 612 closes vapor cell 810 and prevents the sodium in lid wafer 620 from diffusing into vapor cell 810.

In an alternate embodiment, lid wafer 620 can be formed without ionic barrier structure 612. In this embodiment, lid wafer 620 is anodically bonded to vapor cell wafer 420 of intermediate wafer 710 in the same manner as above. In another alternate embodiment, lid wafer 620 can be formed without an ionic impurity, e.g., without sodium ions. In this embodiment, lid wafer 620 is fusion bonded to vapor cell wafer 420 of intermediate wafer 710 in the same manner that vapor cell wafer 420 was fusion bonded to photodiode wafer 340.

Referring back to FIGS. 2A-2C, after the photocell wafer has been formed, the method moves to 222 to form a gas in the vapor cell. In the present example, as shown in FIG. 8, vapor cell 810 is irradiated with UV light for approximately 10 or more hours at room temperature, which decomposes the cesium azide solid residue into a gas 812 that has cesium (alkali) and barrier atoms. Gas 812, in turn, can freely move from deposition region 810D through channel region 810C into gas region 810G. Gas region 810G should have approximately $10^{12}$-$10^{13}$ cesium atoms per cubic centimeter following the irradiation.

If nitrogen atoms are used as a buffer gas, insufficient nitrogen atoms are present, and the noble gas used during bonding is nitrogen, then the anodic bonding can take place under pressure to increase the number of nitrogen atoms. The maximum pressure is limited, however, as too many nitrogen atoms degrades the signal (widens the line width of the wavelength that represents the point of absorption by the outer electrons).

Referring back to FIGS. 2A-2C, after a gas has been formed, method 200 moves to 224 to form a thermal photocell wafer. The thermal photocell wafer has a metal plate that is a poor thermal radiator and vertically aligned with the number of circuit elements, a metal trace that is a poor thermal radiator and formed as a coil around the periphery of the metal plate, and a number of thermal barrier openings.

Figure 9A:
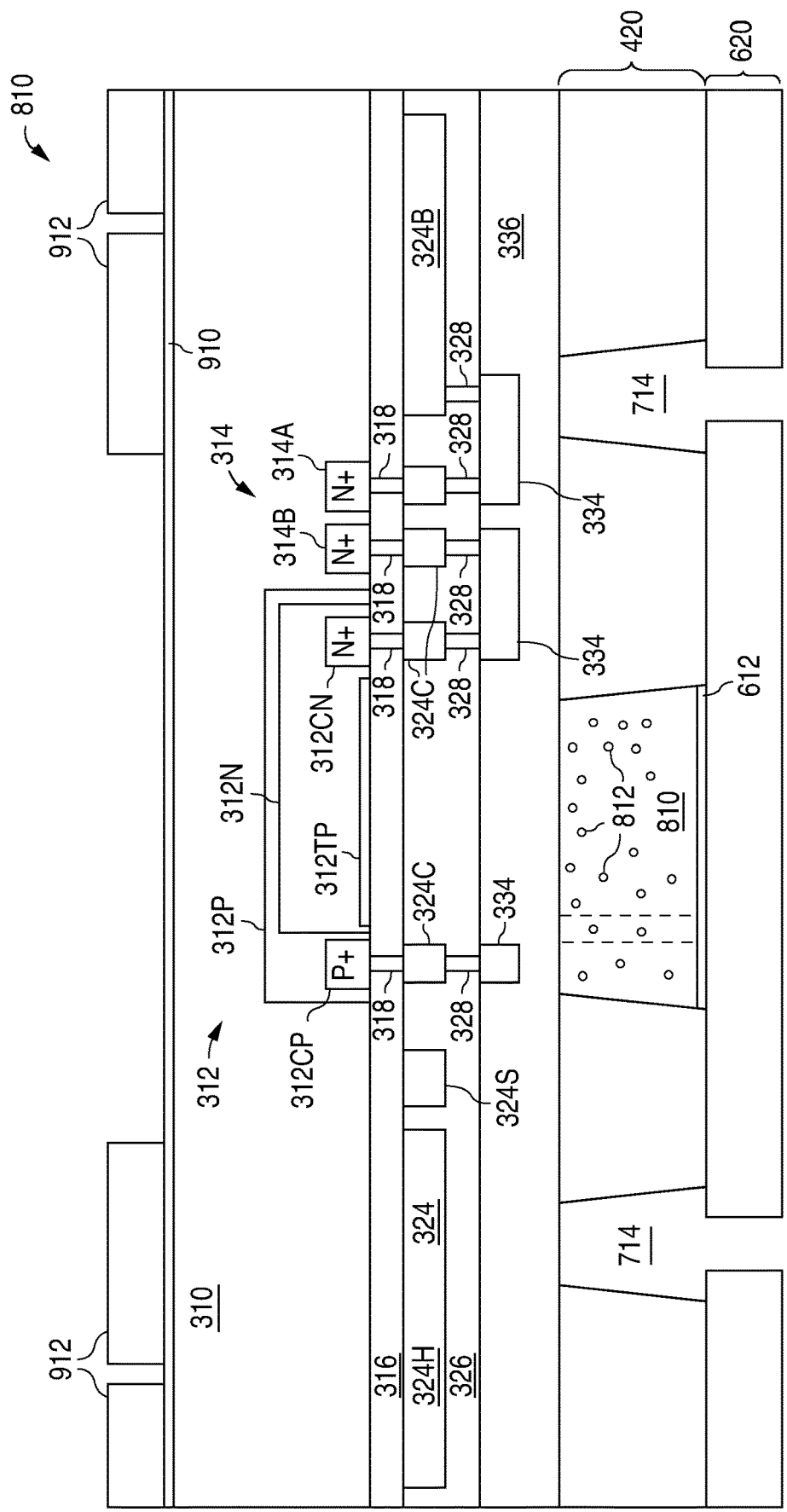
FIGS. 9A-9H are a series of cross-sectional views illustrating an example of a method of forming a thermal photocell wafer in accordance with the present invention.

FIGS. 9A-9H show a series of cross-sectional views that illustrate an example of a method of forming a thermal photocell wafer in accordance with the present invention. As shown in FIG. 9A, the method forms the metal plate and the metal trace by first depositing a seed layer 910 on the non-device surface of silicon wafer 310 of photocell wafer 810. Seed layer 910 can be implemented with, for example, 300A of titanium and 3000A of copper. (The titanium layer enhances the adhesion of the copper.) After seed layer 910 has been formed, a mold 912 is formed on seed layer 910. Mold 912 can be formed, for example, by depositing and patterning a photoresist layer, such as NR2 by Futurrex (http://futurrex.com/en/), in a conventional manner.

Figure 9B:
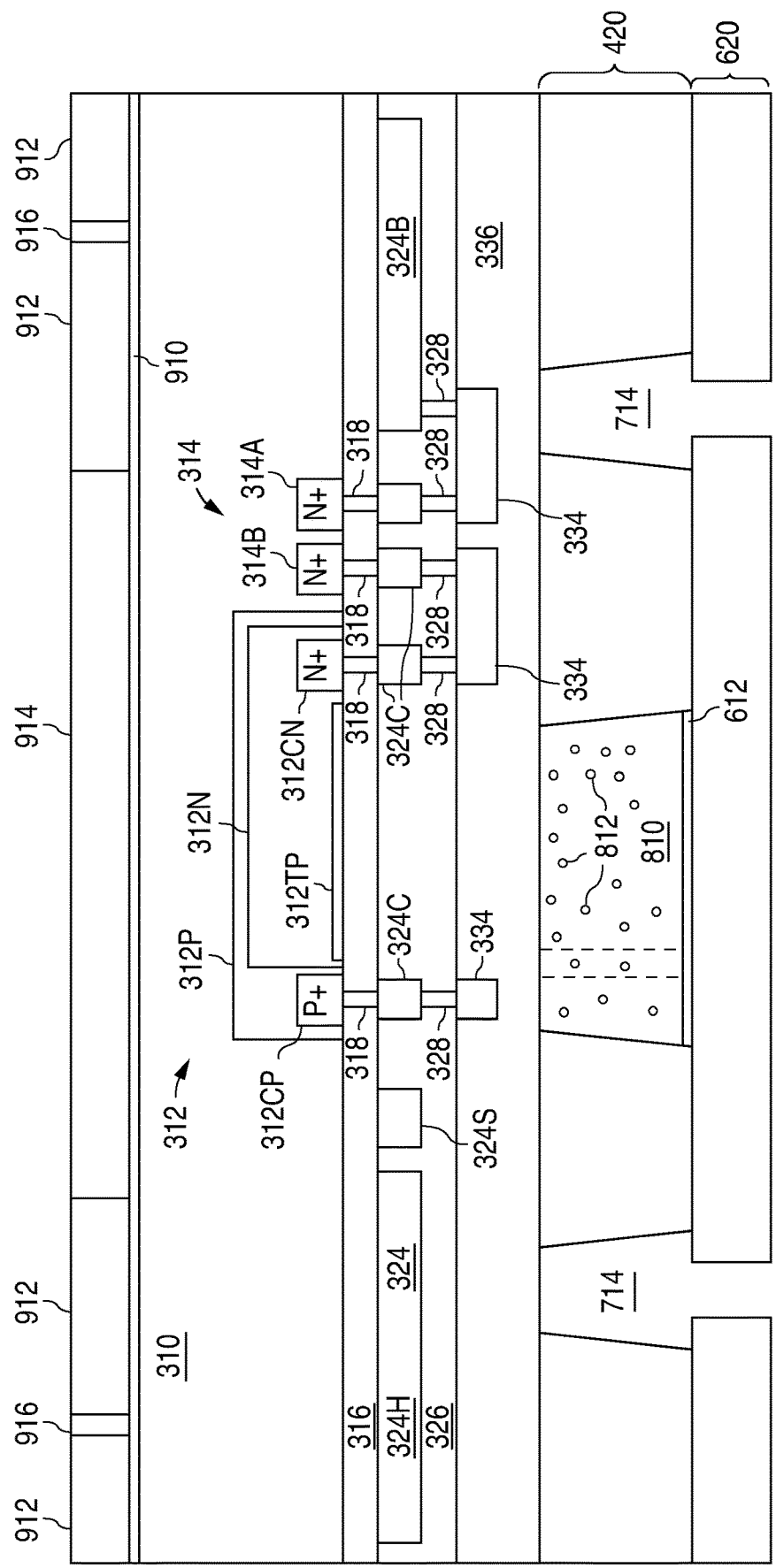

As shown in FIG. 9B, following the formation of mold 912, copper, which is a poor thermal radiator, is electroplated to form a plate 914 and a trace 916. Plate 914 is vertically aligned with photodiode circuit 311, while trace 916 is laid out as a planar coil around the periphery of plate 914. (The planar coil is shown with a single loop for simplicity. Additional loops can alternately be used to increase the magnetic field.) After this, mold 912 is removed in a conventional manner, followed by the conventional removal of the exposed regions of seed layer 910.

Figure 9C:
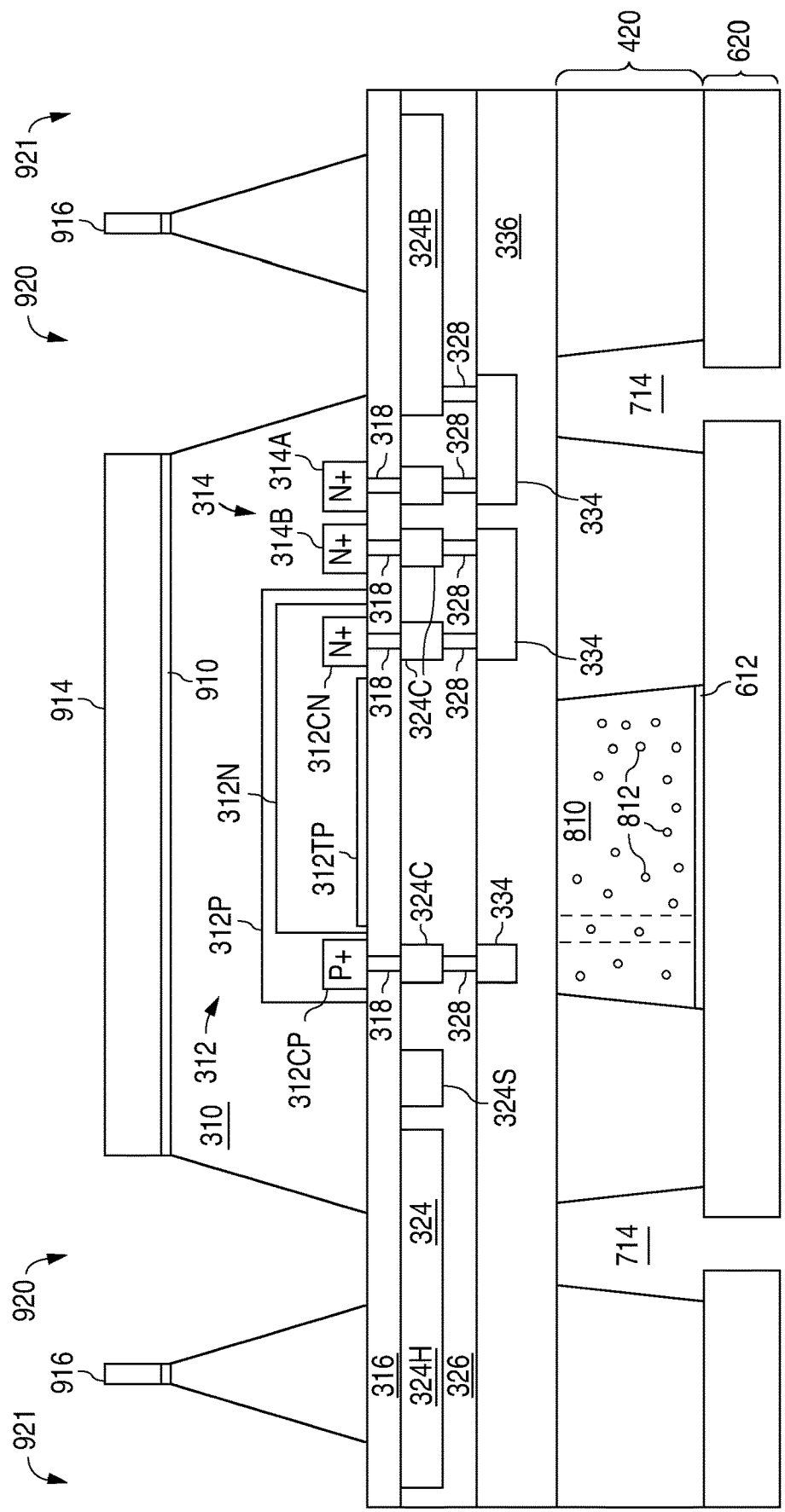

As shown in FIG. 9C, after the exposed regions of seed layer 910 have been removed, the exposed regions of silicon wafer 310 are etched using plate 914 and trace 916 as a hard mask to form a number of thermal barrier openings 920 (only one is shown for simplicity) and a peripheral opening 921 that expose oxide layer 316. Silicon wafer 310 can be etched using, for example, KOH or TMAH, which produce side walls that are sloped at 54.7 degrees. Alternately, a conventional deep reactive ion etch (DRIE), such as a Bosch process, can be used to form the thermal barrier openings 920 and peripheral opening 921.

Figure 9D:
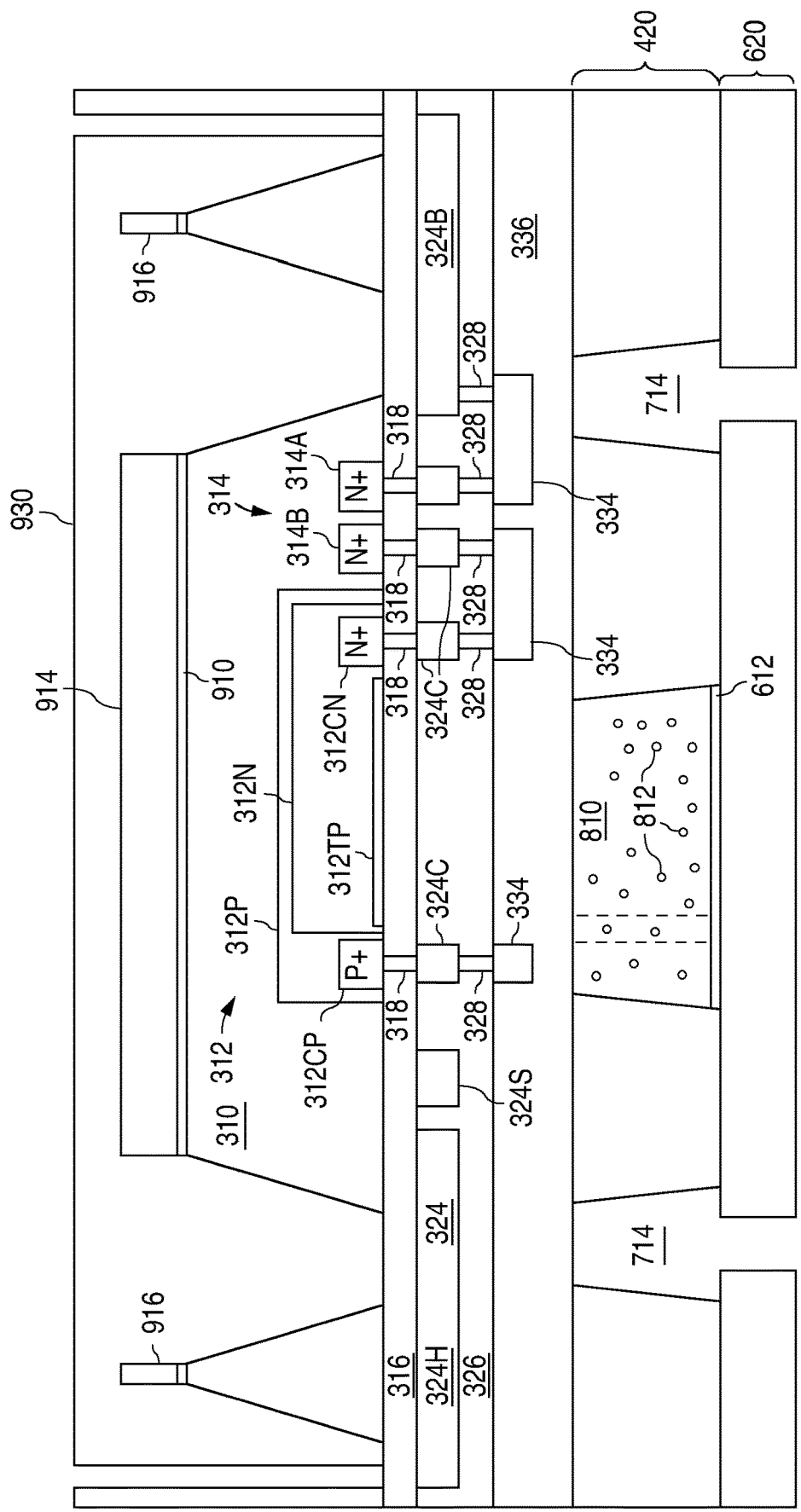
Figure 9E:
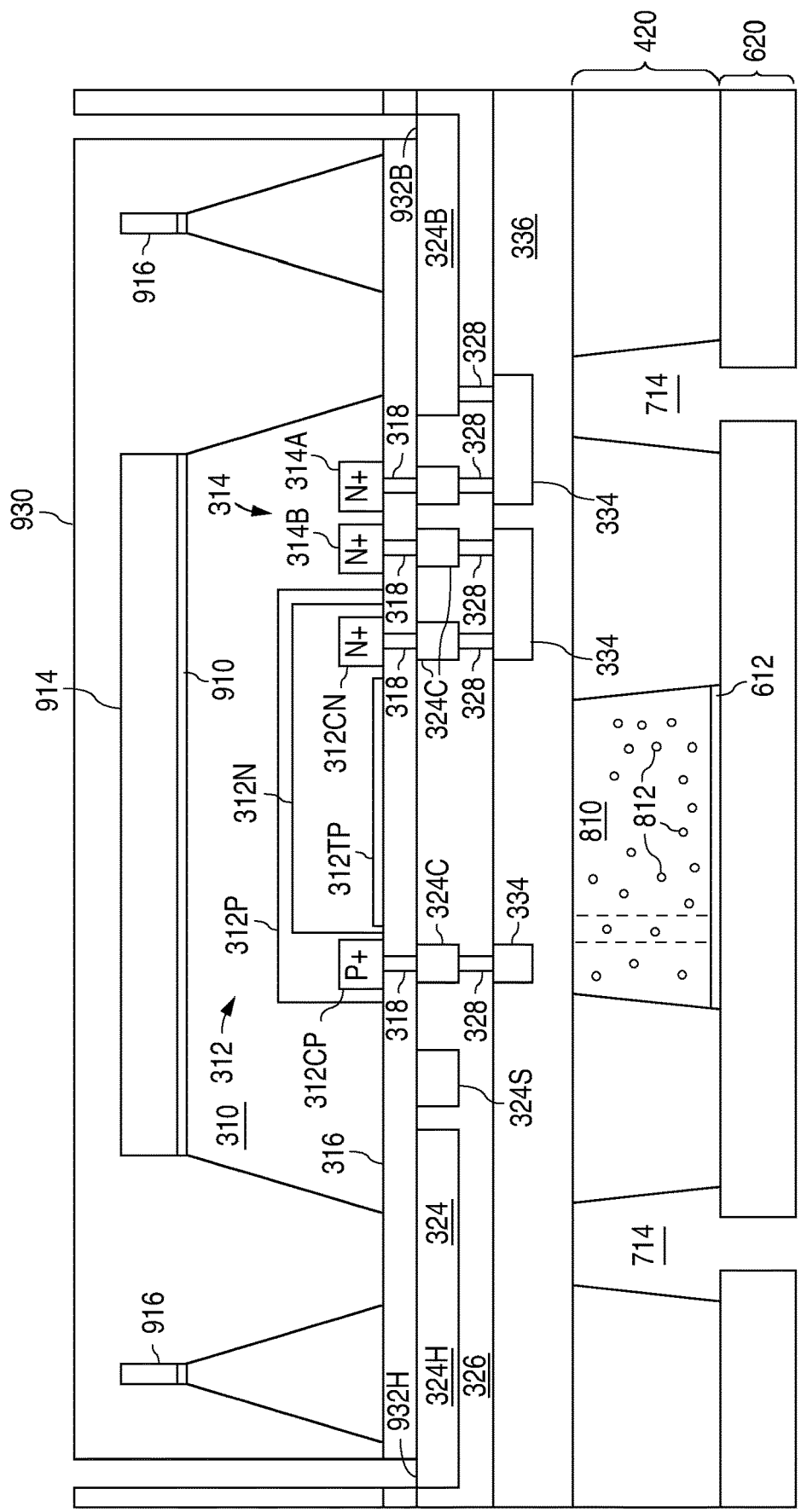

As shown in FIG. 9D, once oxide layer 316 has been exposed, a patterned photoresist layer 930 is formed on oxide layer 316, plate 914, and trace 916 in a conventional manner. As shown in FIG. 9E, following the formation of patterned photoresist layer 930, the exposed regions of oxide layer 316 are etched to expose a number of bond pad regions 932.

The bond pad regions 932 include a bond pad region 932H at each end of heater trace 324H, a bond pad region at each end of temperature sensor trace 324S, and a bond pad region 932B at the end of each thermal bridge trace 324B. Once the bond pad regions 932 have been exposed, patterned photoresist layer 930 is removed in a conventional manner.

Figure 9F:
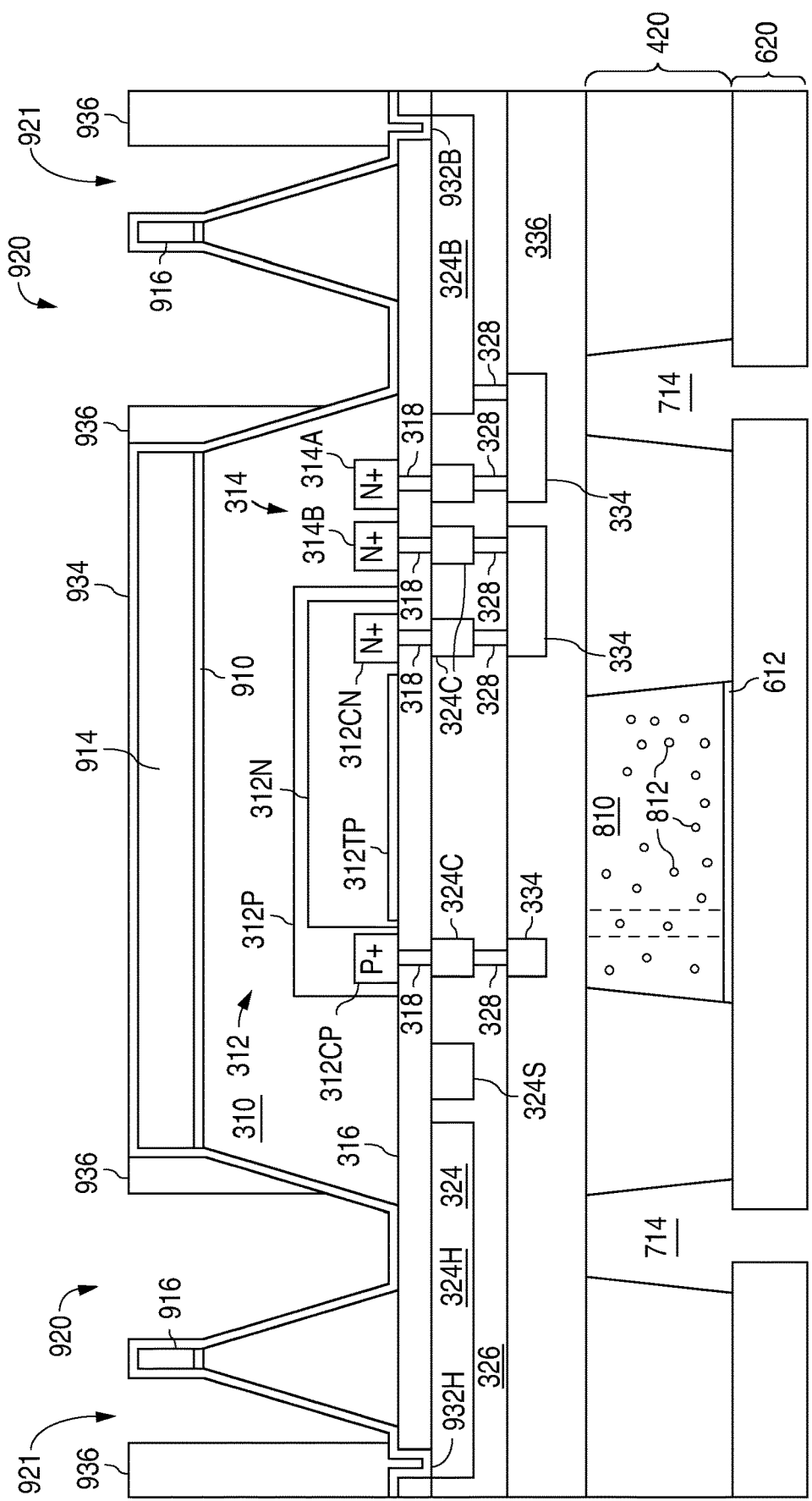

As shown in FIG. 9F, after patterned photoresist layer 930 has been removed, a seed layer 934 is deposited on silicon wafer 310, oxide layer 316, plate 914, and trace 916. Seed layer 934 can be implemented with, for example, 300A of titanium and 3000A of copper. (The titanium layer enhances the adhesion of the copper.)

After seed layer 934 has been formed, a conformal non-planarizing layer of photoresist is sprayed on seed layer 934. A light is then projected through a patterned black/clear glass plate known as a mask to form a patterned image on the layer of photoresist that softens the photoresist regions exposed by the light. The depth of focus of the light is varied to expose the layer of photoresist at different depths. After this, the softened photoresist regions are developed and washed away to leave a patterned photoresist layer 936.

Figure 9G:
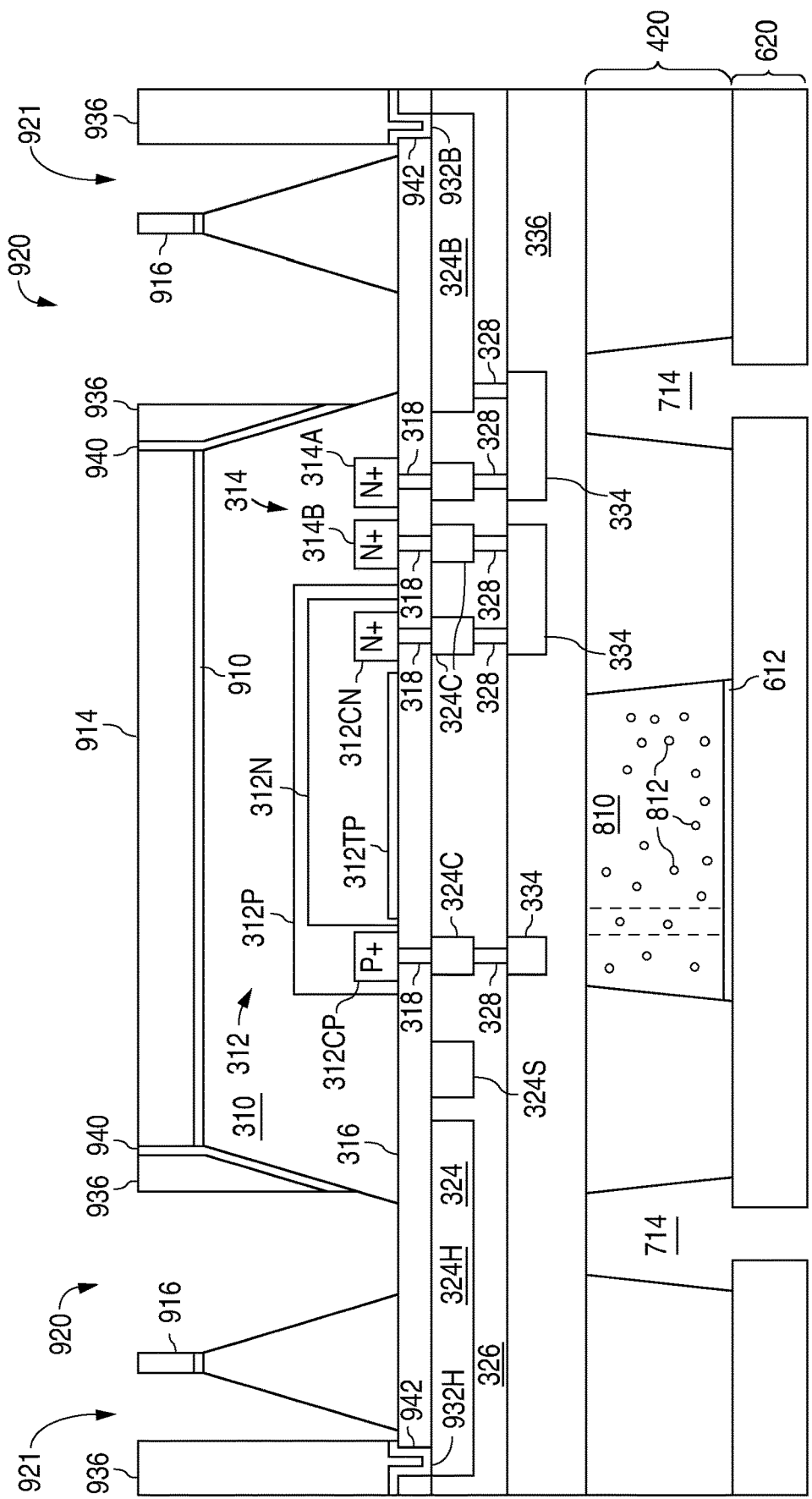
Figure 9H:
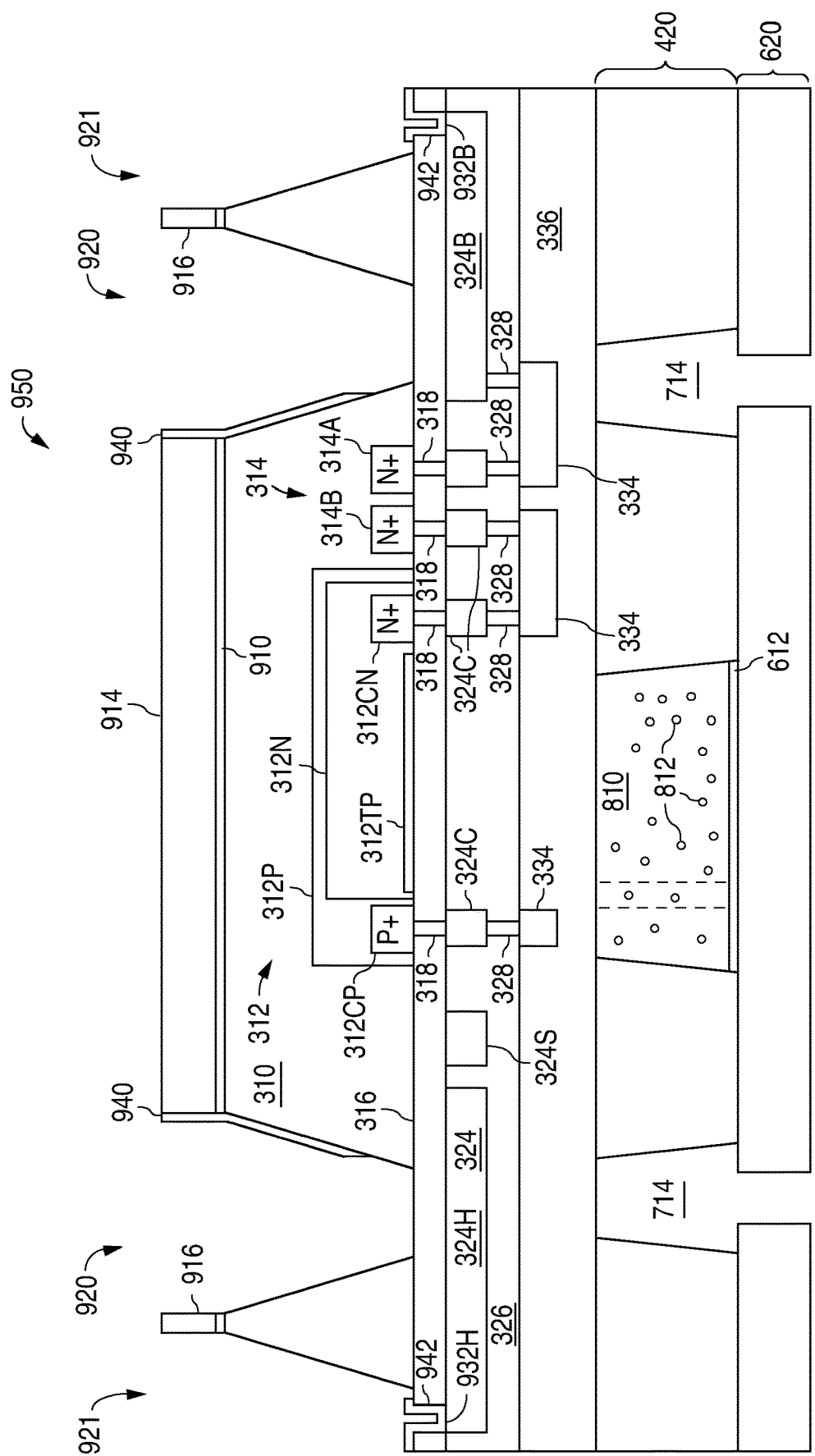

As shown in FIG. 9G, after patterned photoresist layer 936 has been formed, the exposed regions of seed layer 934 are etched to form a side wall cover 940 that touches silicon wafer 310 and plate 914, and copper bond pads 942 that touch and lie over the bond pad regions 932. Once side wall cover 940 and the copper bond pads 942 has been formed, patterned photoresist layer 924 is removed in a conventional manner. (Copper plugs can optionally be formed on the copper bond pads 942 by forming a mold and electroplating in a conventional manner.) As shown in FIG. 9H, removal of patterned photoresist layer 936 completes the formation of a thermal photocell wafer 950.

Figure 10:
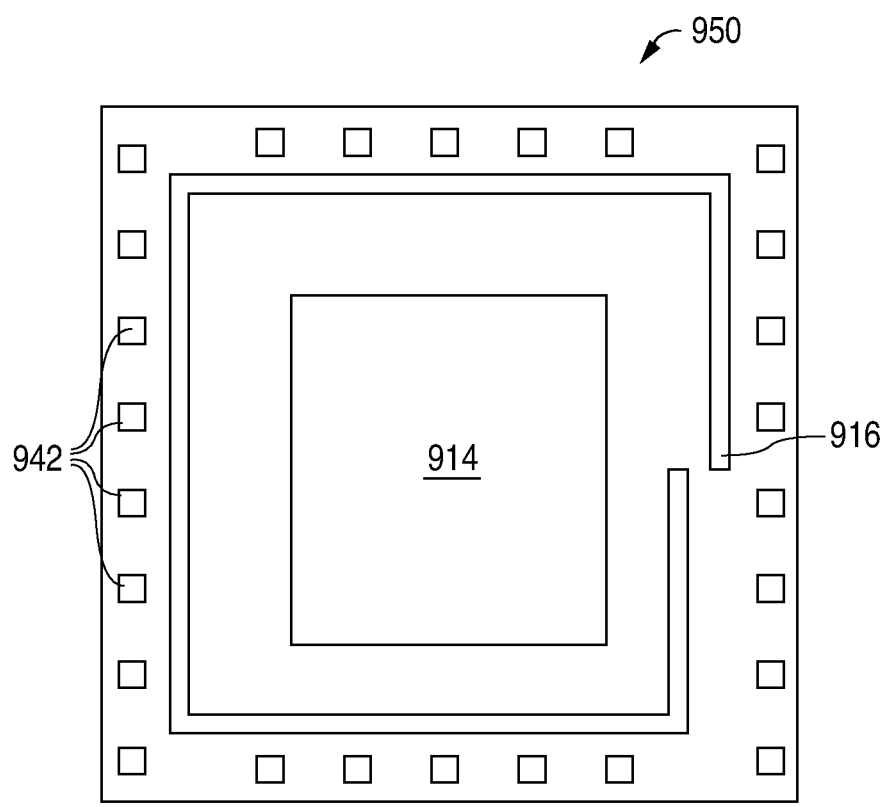
FIG. 10 is a plan view further illustrating thermal photocell wafer 950 in accordance with the present invention.

FIG. 10 shows a plan view that further illustrates thermal photocell wafer 950 in accordance with the present invention. As shown in FIG. 10, trace 916 is spaced apart from plate 914, and laid out as a planar coil that laterally surrounds plate 914. (The planar coil is shown with a single loop for simplicity. Additional loops can alternately be used to increase the magnetic field.) In addition, the bond pad regions 942 are formed around the periphery of the die region.

Referring back to FIGS. 2A-2C, after the thermal photocell wafer has been formed, method 200 moves to 226 to form an optical support wafer. The optical support wafer has an access opening that extends completely through the optical support wafer. Once the optical support wafer has been formed, the method moves to 228 to attach an optics package to the optical support wafer to form an optics structure. The optics package converts light from a laser light source to circularly polarized light.

FIGS. 11A-11B show a series of cross-sectional views that illustrate an example of a method of forming an optics structure in accordance with the present invention. As shown in FIG. 11A, the method utilizes a conventionally formed transparent wafer 1110 approximately 500 µm thick that has rows and columns of identical die regions. Only one die region is shown and discussed for simplicity.

In the present example, transparent wafer 1110 has an optics surface and an opposing non-optics surface. Further, transparent wafer 1110 is implemented with glass such as Pyrex® by Corning or Schott Borofloat 33® by Schott. As further shown in FIG. 11A, the method begins by forming an access opening 1112 that extends completely through transparent wafer 1110 in a conventional manner.

As shown in FIG. 11B, after access opening 1112 has been formed, an optics package 1114 is attached to the optics surface of transparent wafer 1110. Optics package 1114 can be attached with an optical epoxy layer 1116 that leaves no gaps between optics package 1114 and the surface of transparent wafer 1110 to eliminate reflections. Optics package 1114 outputs circularly polarized light in response to light received from a light source, and can be implemented with any arrangement that outputs circularly polarized light.

In the present example, optics package 1114 includes an attenuator 1114A that reduces the intensity of the input light, a linear polarizer 1114L that linearly polarizes the light output from attenuator 1114A, and a quarter wave plate circular polarizer 1114C that circularly polarizes the light output from linear polarizer 1114L. Attenuator 1114A, in turn, has an outer surface covered with a non-reflective coating 1114R.

Optics package 1114 is commercially available from a number of sources, such as JDS Uniphase (www.jdsu.com), Thorlabs (www.thorlabs.com) or CVI Melles Griot (www-.cvimellesgriot), which provide optics packages to meet customer specified requirements for the layers and exterior dimensions. (Thorlabs NE220B is an attenuator, Thorlabs LPVIS100 is a linear polarizer, and CVIMelles Griot QWP0-895-15-4 is a circular polarizer.) The attachment of optics package 1114 to transparent wafer 1110 completes the formation of an optics structure 1120.

Referring back to FIGS. 2A-2C, after the optics structure has been formed, method 200 moves to 230 to attach the optics structure to the thermal photocell wafer to form an optical photocell wafer.

Figure 12:
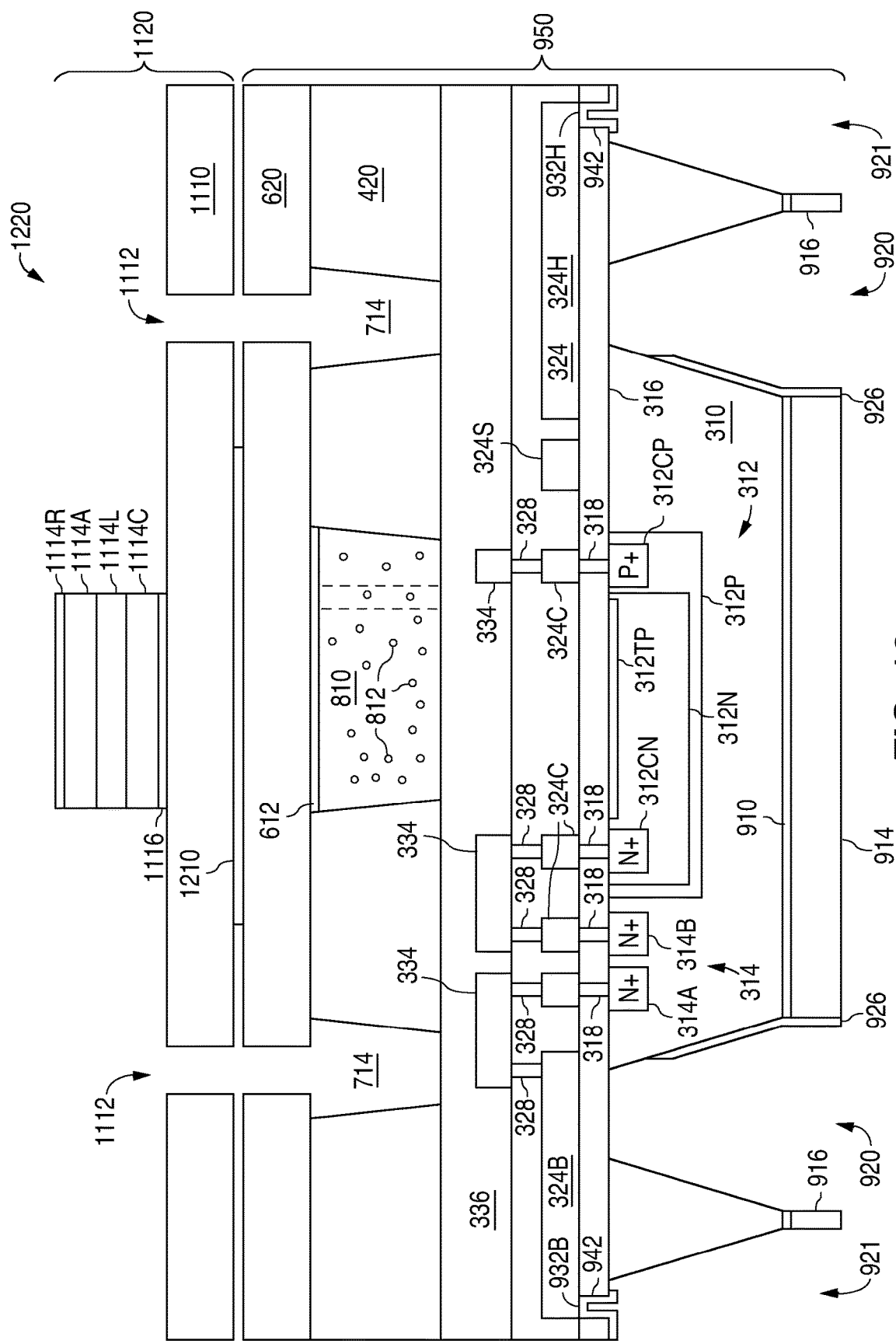
FIG. 12 is a cross-sectional view illustrating an example of a method of forming an optical photocell wafer in accordance with the present invention.

FIG. 12 shows a cross-sectional view that illustrates an example of a method of forming an optical photocell wafer in accordance with the present invention. As shown in FIG. 12, the method adhesively attaches the non-optics surface of optics structure 1120 to lid wafer 620 of thermal photocell wafer 950 with an optical epoxy layer 1210 that leaves no gaps between a region of the surface of optics structure 1120 and a region of the surface of lid wafer 620 of thermal photocell wafer 950 to prevent reflections. Further, after the wafers have been attached together, access opening 1112 exposes thermal barrier opening 714. The attachment of optics structure 1120 to thermal photocell wafer 950 completes the formation of an optical photocell wafer 1220.

Referring back to FIGS. 2A-2C, after the optical photocell wafer has been formed, method 200 moves to 232 to form a spacer wafer that has an optical opening and an access opening that each extends completely through the spacer wafer.

FIG. 13 shows a cross-sectional view that illustrates an example of a method of forming a spacer wafer in accordance with the present invention. As shown in FIG. 13, the method utilizes a conventionally formed transparent wafer 1310 approximately 500 µm thick that has rows and columns of identical die regions. Only one die region is shown and discussed for simplicity. In addition, transparent wafer 1310 is implemented with glass such as Pyrex® by Corning or Schott Borofloat 33® by Schott.

As further shown in FIG. 13, the method forms an optical opening 1312 and an access opening 1314 that each extends completely through transparent wafer 1310 in a conventional manner. The formation of optical opening 1312 and access opening 1314 completes the formation of a spacer wafer 1320.

Referring back to FIGS. 2A-2C, after the spacer wafer has been formed, method 200 moves to 234 to attach the spacer wafer to the optical photocell wafer to form a spaced photocell wafer.

Figure 14:
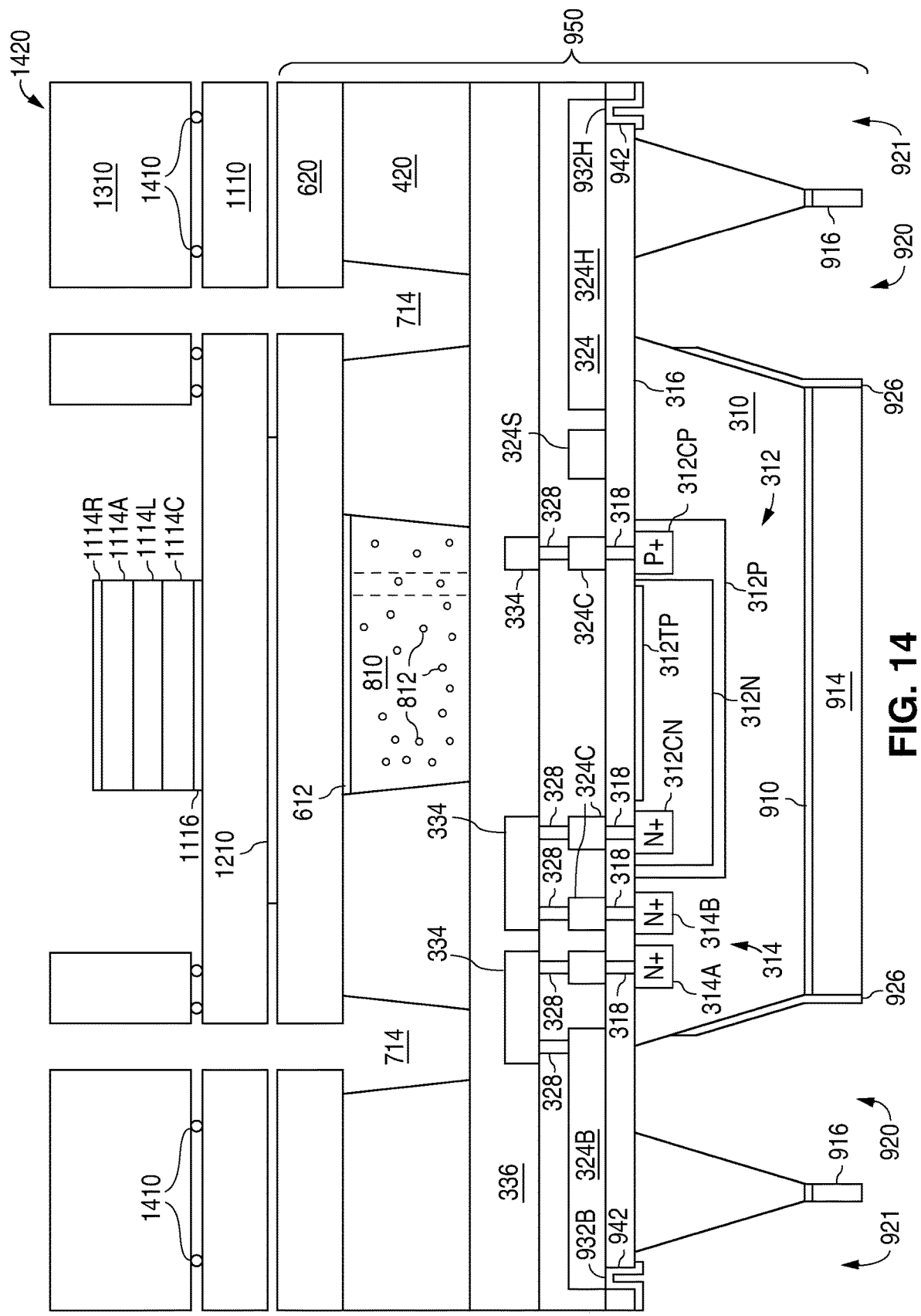
FIG. 14 is a cross-sectional view illustrating an example of a method of forming a spaced photocell wafer in accordance with the present invention.

FIG. 14 shows a cross-sectional view that illustrates an example of a method of forming a spaced photocell wafer in accordance with the present invention. As shown in FIG. 14, the method adhesively attaches a surface of spacer wafer 1320 to optics structure 1120 of optical photocell wafer 1220 with spaced-apart blobs 1410 (which leave an airway path) of a conventional die attach material that leaves gaps between the surface of spacer wafer 1320 and optics wafer 1120 of optical photocell wafer 1220. Further, after the wafers have been attached together, access opening 1314 exposes thermal barrier opening 714. The attachment of spacer wafer 1320 to optics structure 1120 of optical photocell wafer 1220 completes the formation of a spaced photocell wafer 1420.

Referring back to FIGS. 2A-2C, after the spaced photocell wafer has been formed, method 200 moves to 236 to dice the spaced photocell wafer in a conventional manner and form a number of thermal photo-optical die. After this, method 200 moves to 238 to form a laser support wafer which has a substrate and a metal interconnect structure that touches the substrate.

The metal interconnect structure has a number of metal-1 traces, a number of metal-2 traces, and a number of metal-3 traces. The metal-1 and metal-3 traces include metals which have a resistance that is lower than the resistance of the metal-2 traces. In addition, the metal-1 traces have a thermal conductivity that is greater than the thermal conductivity of the metal-2 traces.

Figure 15A:
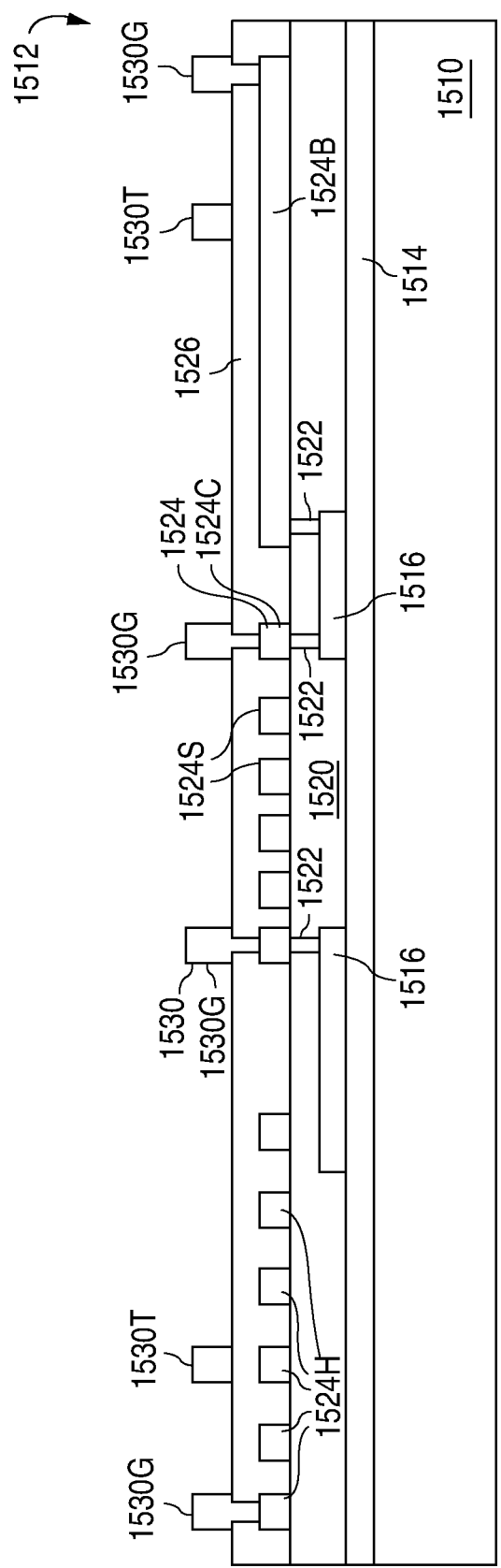
FIGS. 15A-15C are a series of cross-sectional views illustrating an example of a method of forming a laser support wafer in accordance with the present invention.
Figure 15B:
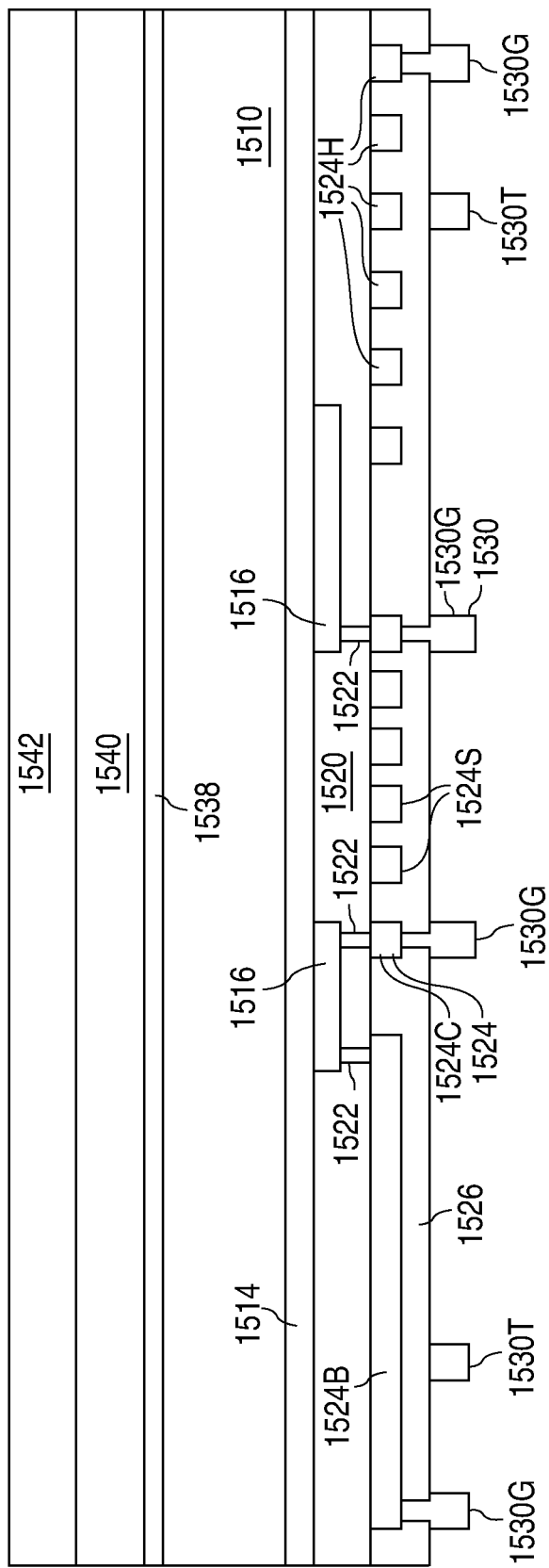
Figure 15C:
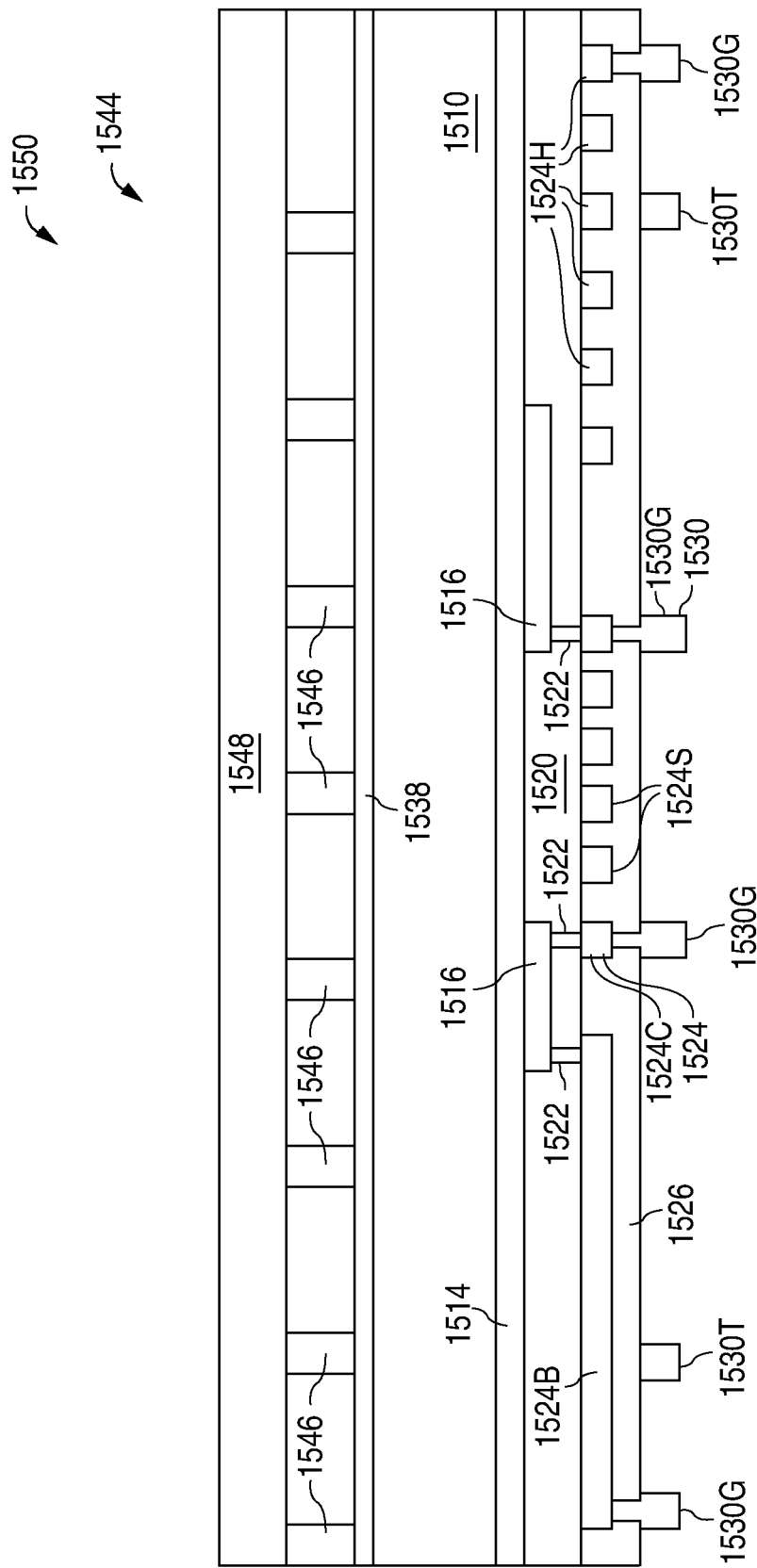

FIGS. 15A-15C show a series of cross-sectional views that illustrate an example of a method of forming a laser support wafer in accordance with the present invention. As shown in FIG. 15A, the method utilizes a conventionally formed transparent wafer 1510 approximately 500 µm thick that has rows and columns of identical die regions. Only one die region is shown and discussed for simplicity. In the present example, transparent wafer 1510 has an interconnect surface and an opposing non-interconnect surface. Further, transparent wafer 1510 is implemented with glass such as Pyrex® by Corning or Schott Borofloat 33® by Schott.

As further shown in FIG. 15A, the method begins by forming a copper-topped metal interconnect structure 1512 on the interconnect surface of transparent wafer 1510 in a conventional manner. Copper-topped metal interconnect structure 1512 includes an oxide layer 1514 that touches the interconnect surface of transparent wafer 1510, and a number of metal-1 traces 1516 that touch oxide layer 1514.

Copper-topped metal interconnect structure 1512 also includes an oxide layer 1520 that touches oxide layer 1514 and the metal-1 traces 1516, and a number of vias 1522 that extend through oxide layer 1520 to make electrical connections with the metal-1 traces 1516. In addition, copper-topped metal interconnect structure 1512 includes a number of metal-2 traces 1524 that touch oxide layer 1520.

The metal-2 traces 1524 include a heater trace 1524H, a temperature sensor trace 1524S, a number of thermal bridge traces 15248, and a number of contact traces 1524C that each touch a via 1522. Heater trace 1524H has opposite ends that both lie in the periphery of the die region. Similarly, temperature sensor trace 1524S also has opposite ends that both lie in the periphery of the die region. In addition, an end of each thermal bridge trace 15248 lies in the periphery of the die region.

Heater trace 1524H can be laid out to minimize the magnetic field that is generated by current flowing through heater trace 1524H. For example, heater trace 1524H can be laid out with long parallel strips with alternate strip ends connected together to form a serpentine pattern. Similarly, temperature sensor trace 1524S can be laid out to minimize the magnetic field that is generated by current flowing through temperature sensor trace 1524S. For example, temperature sensor trace 1524S can be laid out in two long parallel strips with one pair of strip ends connected together to form a long U-shape pattern.

As further shown in FIG. 15A, copper-topped metal interconnect structure 1512 includes an oxide layer 1526 that touches oxide layer 1520 and the metal-2 traces 1524. In addition, copper-topped metal interconnect structure 1512 includes a number of metal-3 traces 1530 that touch oxide layer 1526.

The metal-3 traces 1530 include a number of contact traces 1530G that have via sections that extend down through oxide layer 1526 to touch the ends of the metal-2 heater trace 1524H, the ends of the metal-2 temperature sensor trace 15245, and an end of each thermal bridge trace 15248. In addition, the metal-3 traces 1530 include a coil trace 1530T that is laid out as a planar coil. (The planar coil is illustrated with a single loop for simplicity. Additional loops can alternately be used to increase the magnetic field.)

In the present example, the metal-1 traces 1516 and the metal-3 traces 1530 include metals which have a resistance that is lower than the resistance of the metal-2 traces 1524. In addition, the metal-1 traces 1516 have a thermal conductivity that is greater than the thermal conductivity of the metal-2 traces 1524. For example, the metal-2 traces 1524 can be formed from a refractory metal, such as tungsten, titanium, cobalt, zirconium, or molybdenum, while the metal-1 traces 1516 can be formed from a metal such as aluminum and the metal-3 traces 1530 can include copper.

As shown in FIG. 15B, after copper-topped metal interconnect structure 1512 has been formed, wafer 1510 is flipped over and a metal layer 1538 is deposited on the non-interconnect surface of transparent wafer 1510. Metal layer 1538, in turn, is a poor thermal radiator. In the present example, metal layer 1538 includes copper, and is conventionally formed, e.g., by depositing a seed layer and electroplating a copper layer onto the non-interconnect surface of transparent wafer 1510.

Following this, a layer of photoimageable epoxy or polymer 1540, such as SU-8, benzocyclobutene (BCB), or polybenzoxazole (PBO), which are substantially self planarizing, is deposited on metal layer 1538. Once the photoimageable epoxy or polymer 1540 has been deposited, a light is projected through a mask to form a patterned image on layer 1540 that softens the regions of layer 1540 that are exposed by the light.

Following this, a second layer of photoimageable epoxy or polymer 1542 is deposited on layer 1540. Once the photoimageable epoxy or polymer 1542 has been deposited, a light is projected through a mask to form a patterned image on layer 1542 that softens the regions of layer 1542 that are exposed by the light.

As shown in FIG. 15C, after photoimageable epoxy or polymer 1542 has been exposed, photoimageable epoxy or polymer 1540 and photoimageable epoxy or polymer 1542 are developed and then rinsed to form a pillared structure 1544. Pillared structure 1544 includes a number of spaced-apart vertical pillars 1546 (with nothing laterally between each adjacent pair of pillars 1546) and a horizontal beam 1548 that touches each of the vertical pillars 1546. The formation of pillared structure 1544 completes the formation of a laser support wafer 1550.

Figure 16:
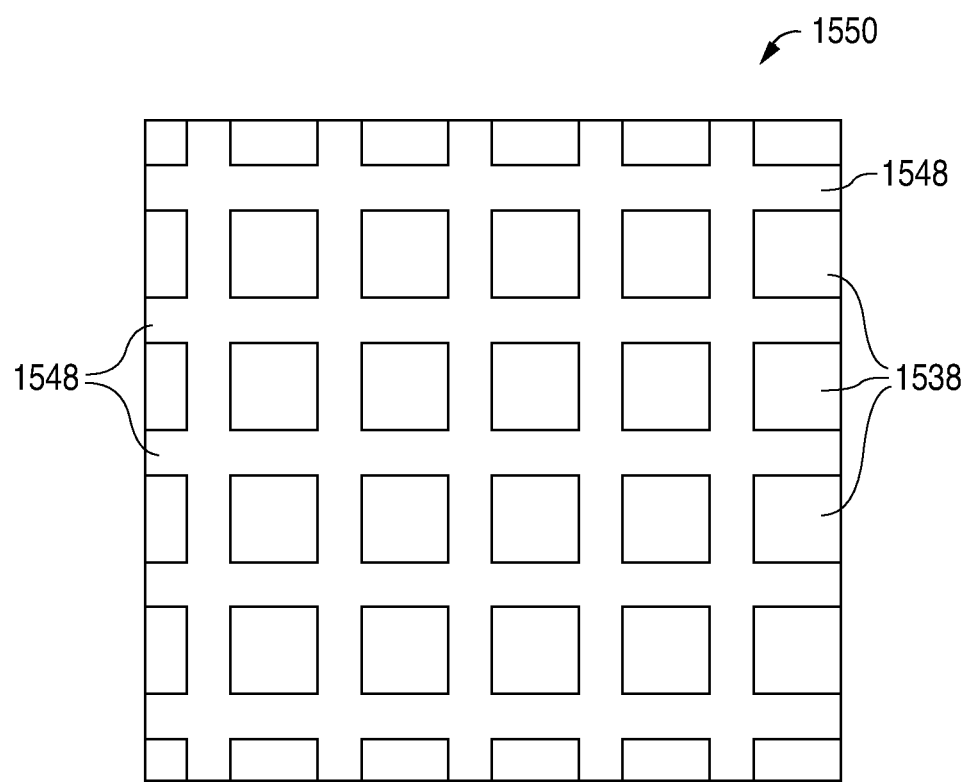
FIG. 16 is a top down view of FIG. 15C further illustrating laser support wafer 1550 in accordance with the present invention.

FIG. 16 shows a top down view of FIG. 15C that further illustrates laser support wafer 1550 in accordance with the present invention. As shown in FIG. 16, horizontal beam 1548 of pillared structure 1544 has a lattice structure that exposes metal layer 1538.

Referring again to FIGS. 2A-2C, after the VCSEL wafer has been formed, method 200 moves to 240 to physically and electrically attach a VCSEL to each die region of the laser support wafer to form a VCSEL wafer.

Figure 17:
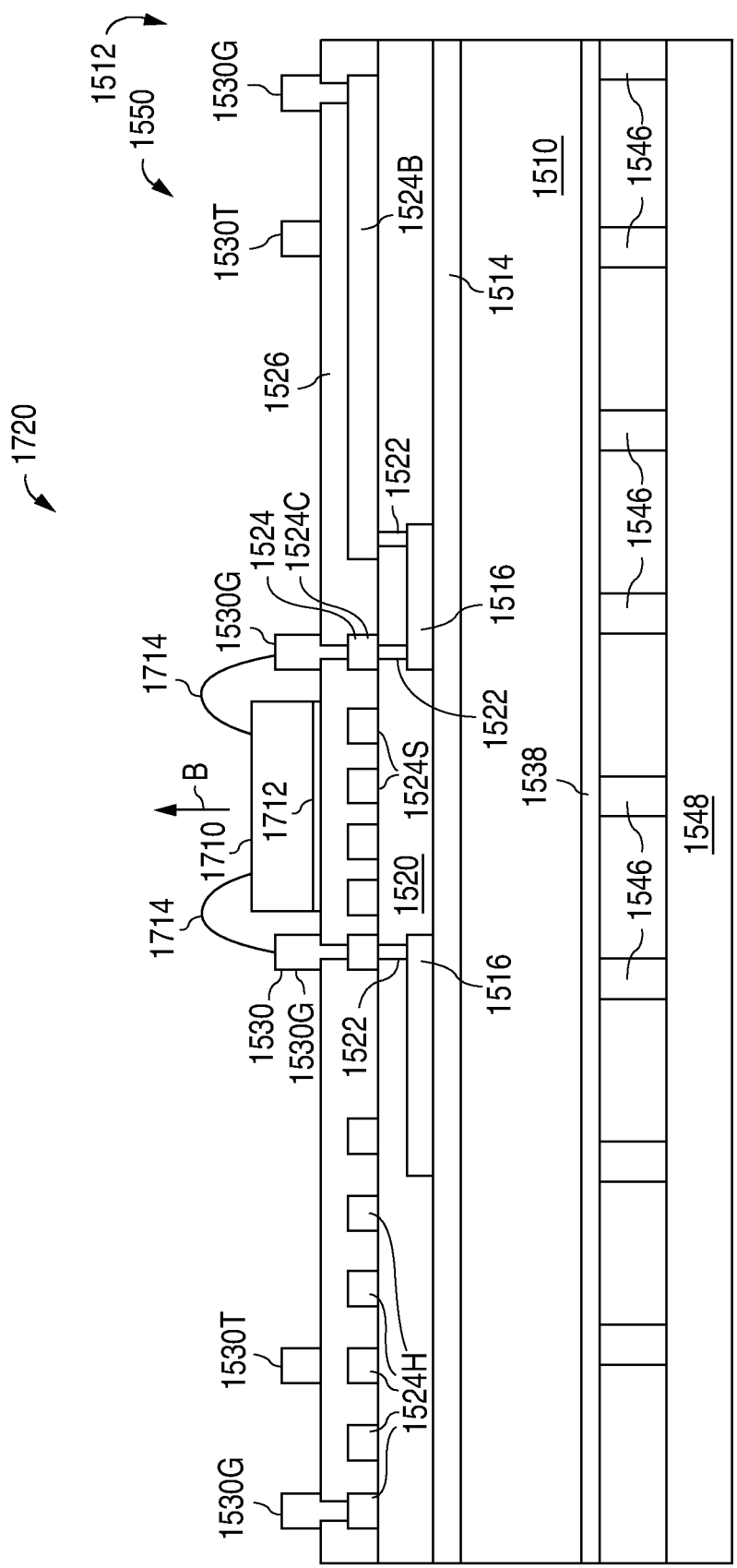
FIG. 17 is a cross-sectional view illustrating an example of a method of forming a VCSEL wafer in accordance with the present invention.

FIG. 17 shows a cross-sectional view that illustrates an example of a method of forming a VCSEL wafer in accordance with the present invention. As shown in FIG. 17, the method attaches a VCSEL 1710 to oxide layer 1526 in each die region of laser support wafer 1550 with a conventional die attach epoxy 1712.

VCSEL 1710 is commercially available from a number of sources, such as Princeton Optronics (www.princetonoptronics.com) or M-Com (www.m-com.com.tw/en), which provide VCSELs to meet customer specified requirements for light frequency, tuning range, power rating, and exterior dimensions. VCSEL 1710 is a laser light source that provides light with the longitudinal axis B. Once VCSEL 1710 has been attached, bonding wires 1714 are attached to VCSEL 1710 and a number of contact traces 1530G that are associated with VCSEL 1710 to form a VCSEL wafer 1720.

Referring again to FIGS. 2A-2C, after VCSEL wafer 1720 has been formed, method 200 moves to 242 to attach a thermal photo-optical die to each die region of the VCSEL wafer to form a thermal clock structure wafer.

Figure 18:
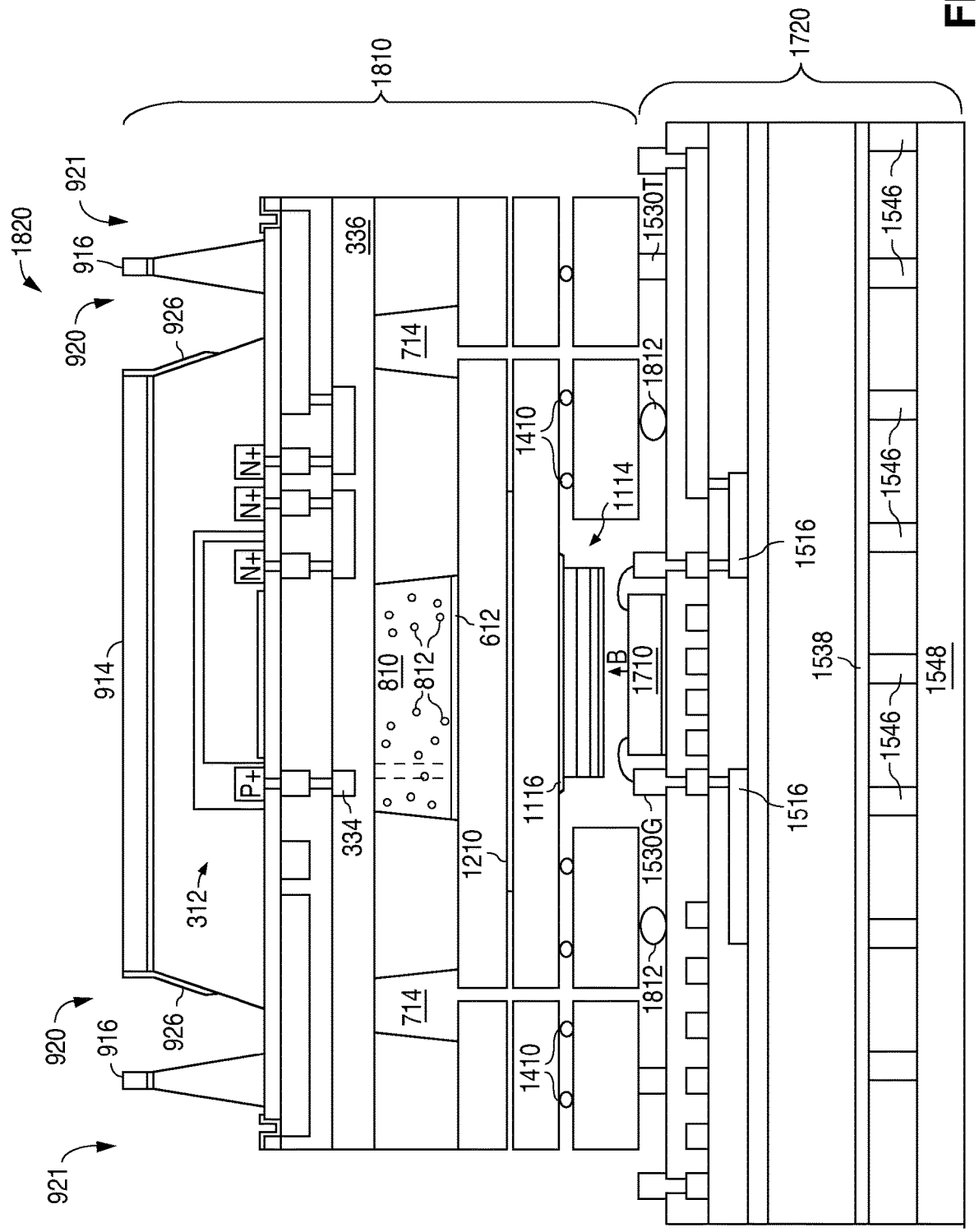
FIG. 18 is a cross-sectional view illustrating an example of a method of forming a thermal clock structure wafer in accordance with the present invention.

FIG. 18 shows a cross-sectional view that illustrates an example of a method of forming a thermal clock structure wafer in accordance with the present invention. As shown in FIG. 18, the method adhesively attaches a thermal photo-optical die 1810 to each die region of VCSEL wafer 1710 with blobs 1812 of a conventional die attach material. The attachment of a thermal photo-optical die 1810 to each die region of VCSEL wafer 1720 completes the formation of a thermal clock structure wafer 1820.

Referring back to FIGS. 2A-2C, after the thermal clock structure wafer has been formed, method 200 moves to 244 to dice the thermal clock structure wafer in a conventional manner and form a number of thermal clock structure die. After this, method 200 moves to 246 to attach a thermal clock structure die to a die attach pad (DAP) of a metal lead frame of a package. Method 200 then moves to 248 to attach a number of bonding wires to the thermal clock structure die and the metal lead frame and form a wired clock structure die.

Figure 19:
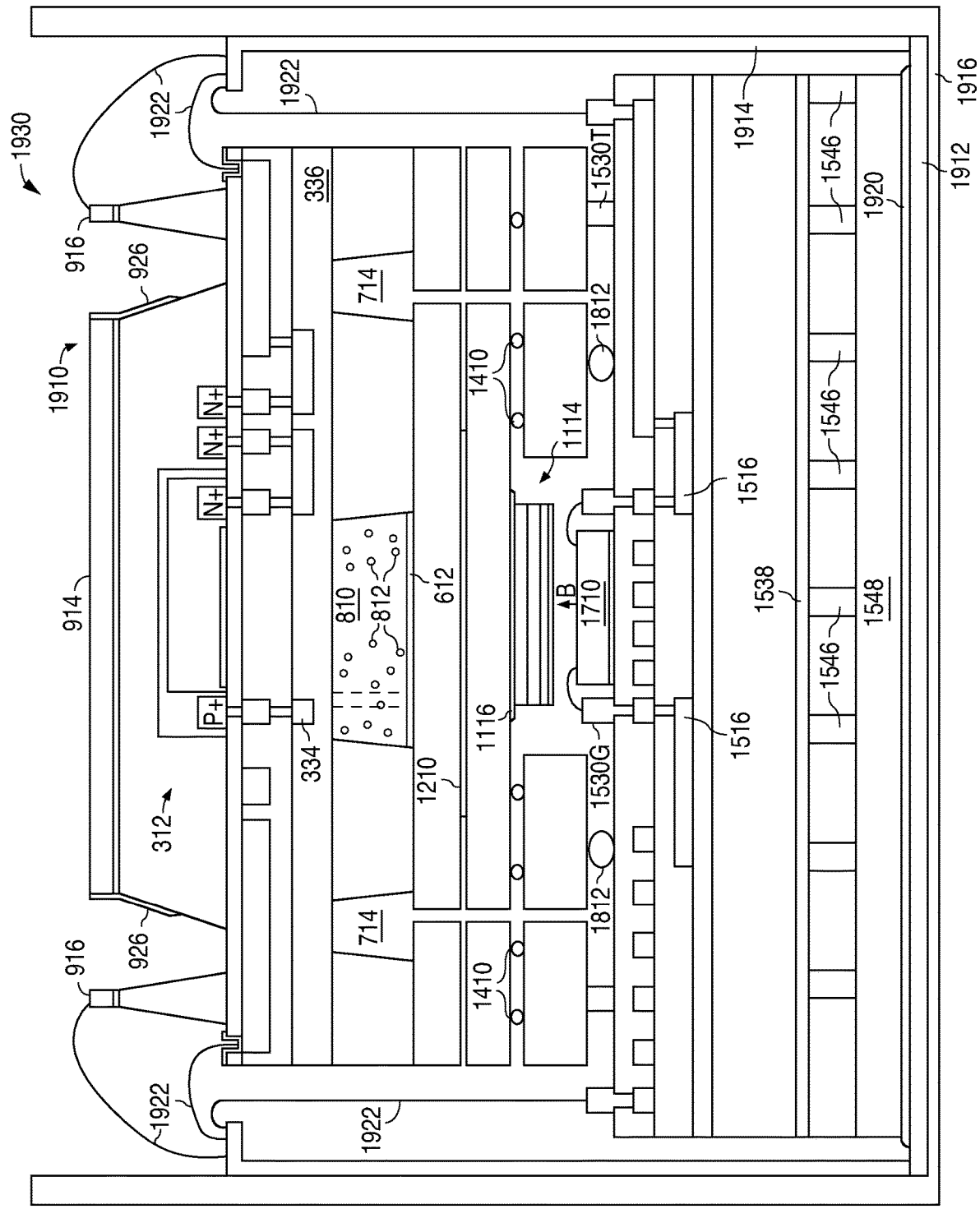
FIG. 19 is a cross-sectional view illustrating an example of a method of forming a wired clock structure die in accordance with the present invention.

FIG. 19 shows a cross-sectional view that illustrates an example of a method of forming a wired clock structure die in accordance with the present invention. As shown in FIG. 19, the method adhesively attaches a thermal clock structure die 1910 to a DAP 1912 of a metal lead frame 1914 of a package 1916 with a layer 1920 of a conventional die attach material. In the present example, a ceramic package is utilized. Following this, a number of bonding wires 1922 are attached to thermal clock structure die 1910 and metal lead frame 1914 of package 1916 in a conventional manner. The attachment of the bonding wires 1922 completes the formation of a wired clock structure die 1930.

Referring back to FIGS. 2A-2C, after the wired clock structure die has been formed, method 200 moves to 250 to reduce the air pressure inside the package to substantially less than the atmospheric pressure. Following this, method 200 moves to 252 to attach a metal lid to the package and form a packaged clock structure chip that maintains the reduced air pressure inside the package.

Figure 20:
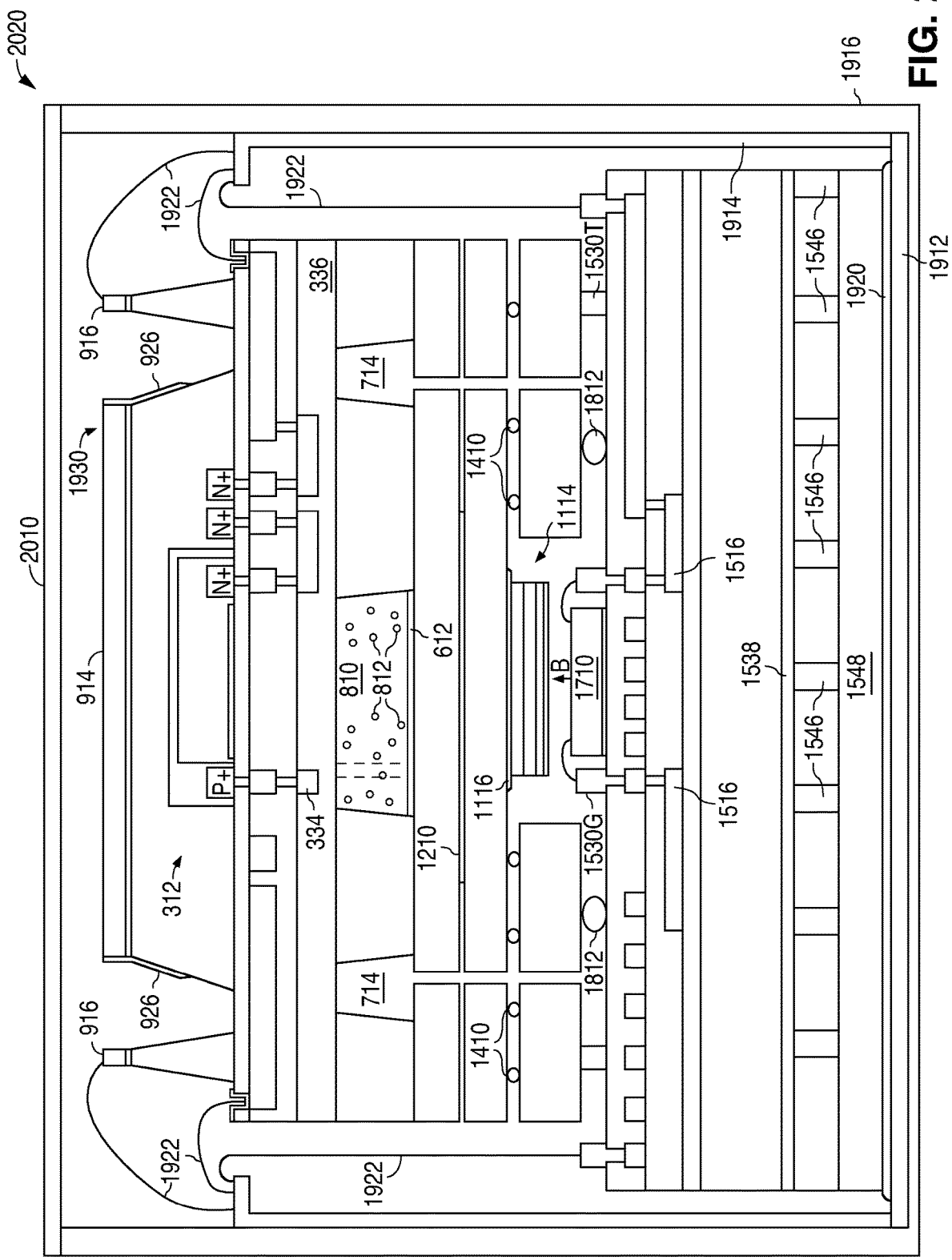
FIG. 20 is a cross-sectional view illustrating an example of a method of forming a packaged clock structure chip in accordance with the present invention.

FIG. 20 shows a cross-sectional view that illustrates an example of a method of forming a packaged clock structure chip in accordance with the present invention. As shown in FIG. 20, the method places wired clock structure die 1930 inside a pressure chamber and reduces the air pressure inside package 1916 to substantially less than the air pressure outside package 1916. In the present example, the air pressure is reduced to a near vacuum. Following this, a metal lid 2010, such as a mu metal lid, is attached to package 1916 in a conventional manner to hermetically seal package 1916 and form a packaged clock structure chip 2020 that maintains the reduced pressure inside package 1916.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A method of forming a semiconductor microfabricated atomic die structure comprising:

forming a photodiode structure in a substrate having a conductivity type, and a device surface, including:

forming a number of photodiode elements and photodiode contacts, and at least one photodiode heater contact, on the device surface of the substrate; and forming a photodiode interconnect structure having:

a first non-conductive layer that touches the device surface;

a plurality of lower-thermal-conductivity metal interconnect traces formed within the first non-conductive layer, connected through vias to the photodiode contacts;

the lower-thermal-conductivity interconnect traces including at least one photodiode heater trace connected through a via to the photodiode heater contact; and a second non-conductive layer that touches the first non-conductive layer and the plurality of lower-thermal-conductivity metal interconnect traces; and a plurality of higher-thermal-conductivity metal interconnect traces formed within the second non-conductive layer, and connected through vias to the lower-thermal-conductivity metal interconnect traces;

the lower-thermal-conductivity metal having a thermal conductivity that is less than that of the higher-thermal-conductivity metal;

forming a vapor cell structure including a silicon layer with a photodiode surface and a lid surface, the photodiode surface touching the photodiode metal interconnect structure, and including
- a central vapor cell defined in the silicon layer, optically coupled to the photodiode elements,
- a lateral thermal barrier cavity defined in the silicon layer, and spaced from the vapor cell, and
- a lid layer touching the lid surface;

forming an optics structure including a transparent layer with non-optics and optics surfaces, the non-optics surface touching the lid layer of the vapor cell structure, and including
- an optics package attached to the optics surface, and optically coupled to the vapor cell, and
- spacer elements, laterally spaced from the optics package, touching the optics surface, and defining a photocell surface opposite the optics surface;

forming a VCSEL (vertical cavity surface emitting laser) structure including
- forming a VCSEL interconnect structure having a third non-conductive layer with a VCSEL surface and a VCSEL interconnect surface, and
- forming a VCSEL element and VCSEL contacts, including at least one VCSEL heater contact, disposed on the VCSEL surface, the VCSEL element optically coupled to the optics package,
- the VCSEL interconnect structure including
  - a plurality of lower-thermal-conductivity metal interconnect traces formed within the first non-conducting layer, and connected through vias to the VCSEL contacts,
  - the plurality of lower-thermal-conductivity interconnect traces including at least one VCSEL heater element trace connected through a via to the at least one VCSEL heater contact, and
  - a plurality of higher-thermal-conductivity metal interconnect traces formed within the third non-conductive layer, and connected through vias to the lower-thermal-conductivity metal interconnect traces,
  - the lower-thermal-conductivity metal having a thermal conductivity that is less than that of the higher-thermal-conductivity metal;

forming a support structure touching the VCSEL interconnect surface;

the photodiode structure, vapor cell structure, optics structure, VCSEL structure and support structure comprising a microfabricated atomic die.

* * * * *